(12) United States Patent
Do et al.

(10) Patent No.: US 9,024,335 B2
(45) Date of Patent: May 5, 2015

(54) MULTI-PACKAGE WHITE LED DEVICE

(75) Inventors: Young-Rag Do, Seoul (KR); Yeon-Goog Sung, Goyang-si (KR)

(73) Assignee: PSI Co., Ltd., Gyeonggi-Do (KR)

( * ) Notice: Subject to any disclaimer, the term of this patent is extended or adjusted under 35 U.S.C. 154(b) by 137 days.

(21) Appl. No.: 13/818,159

(22) PCT Filed: Aug. 22, 2011

(86) PCT No.: PCT/KR2011/006167
§ 371 (c)(1),
(2), (4) Date: May 3, 2013

(87) PCT Pub. No.: WO2012/026718
PCT Pub. Date: Mar. 1, 2012

(65) Prior Publication Data
US 2013/0242543 A1   Sep. 19, 2013

(30) Foreign Application Priority Data

Aug. 23, 2010 (KR) .................. 10 2010 008 1393

(51) Int. Cl.
*H01L 29/18* (2006.01)
*H01L 27/15* (2006.01)
(Continued)

(52) U.S. Cl.
CPC ............ *H01L 27/15* (2013.01); *F21Y 2113/005* (2013.01); *H01L 33/50* (2013.01); *H01L 33/46* (2013.01); *F21V 33/00* (2013.01); *F21K 9/00* (2013.01)

(58) Field of Classification Search
None
See application file for complete search history.

(56) References Cited

U.S. PATENT DOCUMENTS 5,813,753 A  9/1998 Vriens et al.
6,051,925 A  4/2000 Boerner et al.
(Continued)

FOREIGN PATENT DOCUMENTS

JP  2006-261540 A   9/2006
JP  2006261540 A  *  9/2006
(Continued)

OTHER PUBLICATIONS

English Translation of the International Preliminary Report on Patentability for PCT/KR2011/006167, IB, Geneva, issued Feb. 26, 2013, incorporating the English translation of the Written Opinion of the ISA, ISA/KR, Daejeon, mailed Mar. 16, 2012.

*Primary Examiner* — David E Graybill
(74) *Attorney, Agent, or Firm* — Harness, Dickey & Pierce, P.L.C.

(57) ABSTRACT

Disclosed is a white LED device using a multi-package. The white LED device maximizes the efficiency of a green LED in the yellow gap to minimize a deviation in performance between the other color chips, in comparison with conventional white LED devices using RGB multi-chips. In addition, deviations in temperature, current and droop characteristics between the chips can be minimized, contributing to the simplification of a driving circuit. Therefore, the white LED device is suitable for commercialization. Furthermore, the white LED device has a higher color rendering index ($R_a$) (>80) than conventional white LED devices having single-package structures. The correlated color temperatures of the white LED device are controllable in the range of 2,700 to 12,000 K. The white LED device can express abundant colors for emotion lighting and can emit white light with high efficiency.

11 Claims, 49 Drawing Sheets

(51) Int. Cl.
　　　*F21V 33/00*　　　　　(2006.01)
　　　*F21K 99/00*　　　　　(2010.01)
　　　*F21Y 113/00*　　　　　(2006.01)
　　　*H01L 33/50*　　　　　(2010.01)
　　　*H01L 33/46*　　　　　(2010.01)

(56) References Cited

U.S. PATENT DOCUMENTS

| | | |
|---|---|---|
| 6,084,250 A * | 7/2000 | Justel et al. .................... 257/89 |
| 7,221,003 B2 | 5/2007 | Ueno et al. |
| 7,247,884 B2 | 7/2007 | Shibata et al. |
| 7,367,691 B2 | 5/2008 | Lin |
| 7,939,843 B2 * | 5/2011 | Haruna et al. .................. 257/98 |
| 8,405,104 B2 * | 3/2013 | Streubel et al. ................ 257/98 |
| 2004/0227144 A1 | 11/2004 | Hon |
| 2004/0252509 A1 | 12/2004 | Lin |
| 2009/0101934 A1 | 4/2009 | Massies et al. |
| 2011/0045623 A1 | 2/2011 | Massies et al. |

FOREIGN PATENT DOCUMENTS

| | | |
|---|---|---|
| KR | 20060088940 A | 8/2006 |
| KR | 1020100030805 A | 3/2010 |
| KR | 20100052935 A | 5/2010 |
| KR | 20100052936 A | 5/2010 |

* cited by examiner

US 9,024,335 B2

MULTI-PACKAGE WHITE LED DEVICE

CROSS-REFERENCE TO RELATED APPLICATIONS

This application is a National Phase Entry of International Application No. PCT/KR2011/006167, filed on Aug. 22, 2011, which claims priority to Korean Patent Application Serial No. 10-2010-0081393, filed on Aug. 23, 2010, both of which are incorporated by reference herein.

TECHNICAL FIELD

The present invention relates to a white light emitting diode (LED) device using a multi-package. More specifically, the present invention relates to a multi-package white LED device that uses at least one phosphor-converted single-color LED having a particular structure to innovatively solve problems encountered with conventional white LED devices using RGB multi-chips or multi-packages including single-color LEDs.

BACKGROUND

In the mid-1990's, the luminous efficiencies of green and blue LEDs using InGaN as a nitride semiconductor have surpassed the level of incandescent bulbs. Since then, the application of LEDs has extended to a wide range of fields, including full-color displays. Particularly, the advent of high brightness white LEDs in 1996 has opened an era of so-called semiconductor lighting. The white LEDs were fabricated by applying fluorescent materials to InGaN blue LEDs.

Conventional methods for achieving white light emission using LEDs are broadly classified into two groups of methods. The first group of methods is associated with the use of RGB multi-chips or multi-packages for white light emission. Specifically, according to Korean Patent Publication No. 2006-88940, white light emission is achieved by mixing light beams from red (R), green (G) and blue (B) chips constituting one package. The use of the RGB multi-chip for white light emission is advantageous in that the color coordinates and correlated color temperatures of white light are very easily controllable, but has the problems that 1) the phenomenon of yellow gap deteriorates the efficiency of the green LED, 2) a complex driving circuit is required due to different temperature/current characteristics and droop characteristics between the RGB chips, and 3) a sophisticated technical solution to the problem of low color rendering index ($R_a$) is needed for the commercialization of the LED package, leading to an enormous increase in manufacturing cost.

The second group of methods is associated with the use of single chips to achieve white light emission. Specifically, Korean Patent Application No. 2008-111832 discloses a white LED device using single chips to achieve white light emission wherein one or more chips of the single chips are phosphor-converted LEDs (pc-LEDs) using near-UV light or a blue LED as an excitation source to emit the phosphors. The white LED device using pc-LED single chips is widely used due to the relatively simple structure of a driving circuit for white light emission and high white light efficiency compared to the white LED device using an RGB multi-chip. However, the white LED device using pc-LED single chips suffer from limited correlated color temperatures, making it difficult to emit white light with various emotions (e.g., warm-white light). Another problem of the white LED device using pc-LED single chips is a low color rendering index ($R_a$). Since the white LED device is designed to include phosphors in one chip, energy resorption and scattering are caused between the phosphors, inevitably leading to loss of emission energy. Further, different characteristics between the phosphors cause a large tolerance of emission characteristics in the fabrication of the chips. Moreover, when three RGB chips are used to achieve white light emission, a low color rendering index ($R_a$) of 70 or less is observed in the correlated color temperature range of 2,700 to 12,000 K.

SUMMARY

The present invention has been made in an effort to solve the above problems, and it is a first object of the present invention to provide a multi-chip or multi-package white LED device that uses at least one phosphor-converted single-color LED designed to innovatively solve problems encountered with conventional white LED devices using RGB multi-chips, thus being suitable for commercialization. It is a second object of the present invention to provide a multi-package white LED device which includes three single-color LED packages, from which light beams are irradiated and mixed to achieve white light emission, has a color rendering index ($R_a$) of at least 80 in the correlated color temperature range of 2,700 to 12,000 K, and uses at least one phosphor-converted single-color LED.

According to one aspect of the present invention, there is provided a multi-package white LED device including a plurality of single-color LED packages from which light beams are irradiated and mixed to achieve white light emission wherein at least one package of the plurality of single-color LED packages includes: a blue light source; a phosphor disposed on the blue light source to absorb blue light emitted from the blue light source and emit light in the wavelength range of 500 to 700 nm; and a long-wavelength pass filter disposed on the phosphor to reflect blue light and transmit light in the wavelength range of 500 to 700 nm.

In one preferred embodiment of the present invention, the light in the wavelength range of 500 to 700 nm may be amber, yellow, green or red light, and the phosphor may be a yellow, amber, green or red phosphor. In a further preferred embodiment of the present invention, the long-wavelength pass filter may include a layer stack consisting of first thin films and second thin films laminated alternately and repeatedly, the second thin films having a refractive index higher than that of the first thin films. In another preferred embodiment of the present invention, the long-wavelength pass filter may further include third thin films as an uppermost layer and a lowermost layer, at least one of which has an optical thickness corresponding to $1/80$ to $1/4.4$, preferably $1/40$ to $1/4.7$, of the peak wavelength of the reflection band of the blue light source. More preferably, the first thin films are adjacent to the third thin films.

In another preferred embodiment of the present invention, each of the first and second thin films constituting the layer stack disposed between the uppermost layer and the lowermost layer may have an optical thickness corresponding to $1/4$ of the peak wavelength of the reflection band of the blue light source. In another preferred embodiment of the present invention, the blue light source may be an InGaN-based LED. In another preferred embodiment of the present invention, the number of the single-color LED packages may be two or more. In another preferred embodiment of the present invention, all single-color LED packages other than a blue chip may be phosphor-converted single-color LEDs.

In another preferred embodiment of the present invention, the plurality of single-color LED packages may include a) a combination of a red phosphor-converted single-color LED, a green phosphor-converted single-color LED, and a blue LED, b) a combination of a red LED, a green phosphor-converted single-color LED, and a blue LED, c) a combination of a red phosphor-converted single-color LED, an amber phosphor-converted single-color LED, a green phosphor-converted single-color LED, and a blue LED, d) a combination of a red LED, an amber phosphor-converted single-color LED, a green phosphor-converted single-color LED, and a blue LED, e) a combination of a red phosphor-converted single-color LED, a yellow phosphor-converted single-color LED, a green phosphor-converted single-color LED, and a blue LED, f) a combination of a red LED, a yellow phosphor-converted single-color LED, a green phosphor-converted single-color LED, and a blue LED, g) a combination of a yellow-based phosphor-converted white LED, a red phosphor-converted single-color LED, an amber phosphor-converted single-color LED, and a green phosphor-converted single-color LED, or h) a combination of a yellow-based phosphor-converted white LED, a red phosphor-converted single-color LED, and a green phosphor-converted single-color LED.

In another preferred embodiment of the present invention, the plurality of single-color LED packages may include a) a combination of a yellow phosphor-converted single-color LED and a blue LED, b) a combination of a green-based phosphor-converted bluish green LED and an amber phosphor-converted single-color LED, or c) a combination of a green-based phosphor-converted bluish green LED and a red phosphor-converted single-color LED.

The multi-package white LED device of the present invention has a high luminous efficacy in the entire correlated color temperature range (from 2,700 to 12,000 K) compared to conventional multi-chip white LED devices using no phosphors. In addition, the multi-package white LED device of the present invention has a high color rendering index ($R_a$) of at least 85. Furthermore, the correlated color temperatures of the multi-package white LED device of the present invention are controllable in the range of 2,700 to 12,000 K and the color rendering index of the multi-package white LED device of the present invention is actively controllable, unlike conventional single-chip white LEDs using phosphors whose correlated color temperatures and color rendering indices are fixed in the chip fabrication. According to another aspect of the present invention, there is provided a multi-package white LED device which includes three single-color LED packages, from which light beams are irradiated and mixed to achieve a white light emission, and has a color rendering index ($R_a$) of at least 80, preferably at least 85, in the correlated color temperature range of 2,700 to 12,000 K.

In comparison with conventional white LED devices using RGB multi-chips, the multi-package white LED device of the present invention maximizes the efficiency of a green, yellow or amber LED in the yellow gap to minimize a deviation in performance between the other color chips. In addition, the multi-package white LED device of the present invention can minimize deviations in temperature, current and droop characteristics between the constituent chips, contributing to the simplification of a driving circuit. Voltages applied to the packages are the same as a voltage applied to the blue chip and deviations in life characteristics between the constituent packages are minimized, making the multi-package white LED device of the present invention suitable for commercialization.

Furthermore, the multi-package white LED device of the present invention has a higher color rendering index ($R_a$) (>80) than conventional white LED devices having single-chip structures. The correlated color temperatures of the multi-package white LED device of the present invention are controllable in the range of 2,700 to 12,000 K. When the multi-package white LED device of the present invention is used as a conventional lighting device, it can express abundant emotional colors and can emit white light with high efficiency. The multi-package white LED device of the present invention may be used as a backlight. In this case, color dimming is enabled and thus desired effects, such as improved device efficiency, high contrast and broad color reproduction range, can be obtained.

BRIEF DESCRIPTION OF THE DRAWINGS

FIGS. 14 to 17 show the color reproduction ranges of $R_{B,M}G_{B,M}B$ LED, $W_BR_{B,M}G_{B,M}$ LED, $W_BR_{B,M}A_{B,M}B$ LED, and $W_BR_{B,M}A_{B,M}G_{B,M}$ LED multi-package, respectively.

FIG. 18 shows changes in light intensity as a function of wavelength, FIG. 19 shows changes in light intensity at different correlated color temperatures as a function of wavelength, FIG. 20 shows changes in the driving current of the single chips as a function of correlated color temperature (Tcp), and FIG. 21 shows changes in color rendering index ($R_a$) and luminous efficacy as a function of correlated color temperature (Tcp).

FIG. 22 shows changes in light intensity as a function of wavelength, FIG. 23 shows changes in light intensity at different correlated color temperatures as a function of wavelength, FIG. 24 shows changes in the current applied to the single packages as a function of correlated color temperature (Tcp), and FIG. 25 shows changes in color rendering index ($R_a$) and luminous efficacy as a function of correlated color temperature (Tcp).

FIG. 26 shows changes in light intensity as a function of wavelength, FIG. 27 shows changes in light intensity at different correlated color temperatures as a function of wavelength, FIG. 28 shows changes in the driving current of the single packages as a function of correlated color temperature (Tcp), and FIG. 29 shows changes in color rendering index ($R_a$) and luminous efficacy as a function of correlated color temperature (Tcp).

FIG. 34 shows changes in light intensity as a function of wavelength, FIG. 35 shows changes in light intensity at different correlated color temperatures as a function of wavelength, FIG. 36 shows changes in the driving current of the single packages as a function of correlated color temperature (Tcp), and FIG. 37 shows changes in color rendering index ($R_a$) as a function of correlated color temperature (Tcp).

DETAILED DESCRIPTION

The present invention will now be described in more detail with reference to the accompanying drawings. As described above, conventional white LED devices using RGB multi-chips have large deviations in characteristics between the chips, low efficiencies, and low color rendering indices. White LED devices using single chips, i.e. white LED devices using pc-LED single chips, do not emit white light with various emotions, have low color rendering indices, and have difficulty in achieving warm white light emission. A single-chip three-color pc-LED using two or more phosphors has low efficiency and suffer from deviations in characteristics when the phosphor mixture is used to fabricate the single chip pc-LED due to different characteristics of the phosphors.

In view of the above problems, the present invention provides a multi-package white LED device including a plurality of single-color LED packages from which light beams are irradiated and mixed to achieve white light emission wherein at least one package of the plurality of single-color LED packages includes: a blue light source; a phosphor disposed on the blue light source to absorb blue light emitted from the blue light source and emit light in the wavelength range of 500 to 700 nm; and a long-wavelength pass filter disposed on the phosphor to reflect blue light and transmit light in the wavelength range of 500 to 700 nm.

The multi-package white LED device of the present invention emits white light with various emotions, has high efficiency and high color rendering index, and reduces deviations in temperature/current/life time/droop characteristics between the chips, so that simple driving is enabled and predictable characteristics during use are ensured. Therefore, the multi-package white LED device of the present invention can be utilized for white lighting in various applications. Details of the phosphor-converted single-color LED used in the present invention can be found in Korean Patent Application No. 2010-34745 entitled "Phosphor-converted single-color LED including long-wavelength pass filter", which was filed by the present applicant and is incorporated herein by reference.

Figure 1:
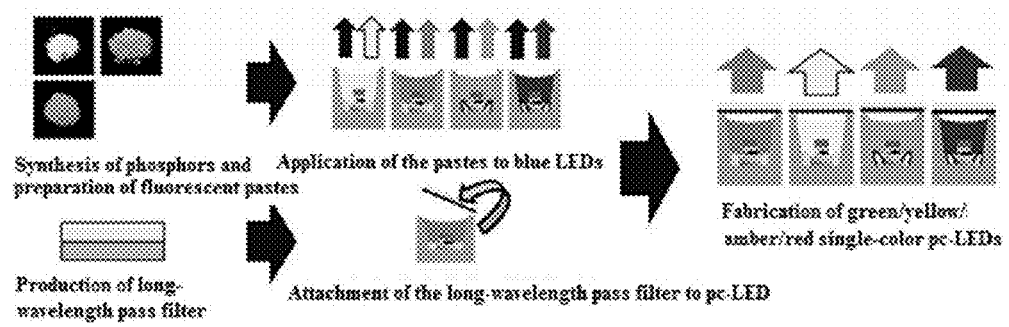
FIG. 1 schematically shows a method for fabricating phosphor-converted single-color LEDs used in a white LED device of the present invention.

Specifically, a method for fabricating phosphor-converted single-color LEDs used in a white LED device of the present invention is schematically shown in FIG. 1. According to the method, first, pastes of phosphors capable of emitting respective single colors are prepared. Each of the pastes is applied to a conventional blue LED to produce a pc-LED. Thereafter, a long-wavelength pass filter is attached to the top of the pc-LED to fabricate the phosphor-converted single-color LED. The blue light source used in the phosphor-converted single-color LED excites the phosphor. The phosphor absorbs blue light emitted from the blue light source to emit light in the wavelength range of 500 to 700 nm. The long-wavelength pass filter disposed on the phosphor reflects blue light and transmits light in the wavelength range of 500 to 700 nm. Due to this construction, the blue light failing to excite the phosphor is reflected from the long-wavelength pass filter toward the phosphor and is reused to excite the phosphor, resulting in an increase in photoluminescence efficiency. In addition, the blue light is not emitted toward the top of the LED, ensuring superior color purity.

The blue light source is preferably a blue LED, more preferably an InGaN-based LED, but is not limited thereto. The phosphor used in the present invention is intended to include quantum dots as well as phosphors commonly used in the art. The phosphor may be any of those that are commonly used in the art, for example, a green, yellow, amber or red phosphor.

The long-wavelength pass filter is designed such that blue light at shorter wavelengths is reflected and green or yellow light at longer wavelengths or light in the wavelength range of 500 to 700 nm is transmitted. For this design, the long-wavelength pass filter includes a layer stack including first thin films and second thin films, which are laminated alternately and repeatedly. The second thin films have a refractive index higher than that of the first thin films.

Figure 2A:
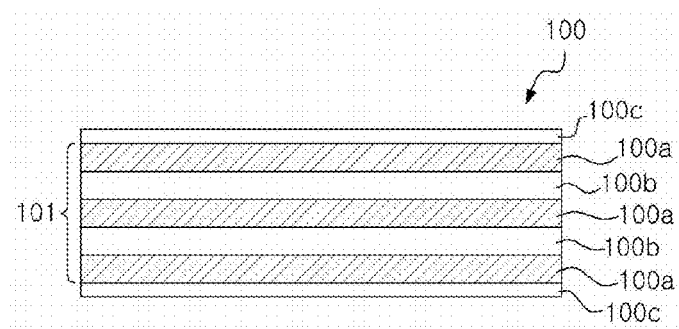
FIG. 2a is a cross-sectional view of a long-wavelength pass filter used in a phosphor-converted single-color LED of a white LED device according to a preferred embodiment of the present invention.

FIG. 2a is a cross-sectional view of a long-wavelength pass filter used in a phosphor-converted single-color LED of a white LED device according to one preferred embodiment of the present invention. A layer stack of the long-wavelength pass filter 100 includes first thin films 100a and second thin films 100b, which are laminated alternately and repeatedly. The second thin films 100b have a refractive index higher than that of the first thin films 100a. The long-wavelength pass filter 100 further includes two third thin films 100c as an uppermost layer and a lowermost layer. Each of the uppermost layer and the lowermost layer has an optical thickness ($\lambda_{max}$/n, n: refractive index of the thin film) corresponding to 1/80 to 1/4.4, preferably 1/60 to 1/4.5, more preferably 1/40 to 1/4.7, still more preferably 1/7 to 1/9, most preferably 1/8, of the peak wavelength of the reflection band of blue light.

Figure 2B:
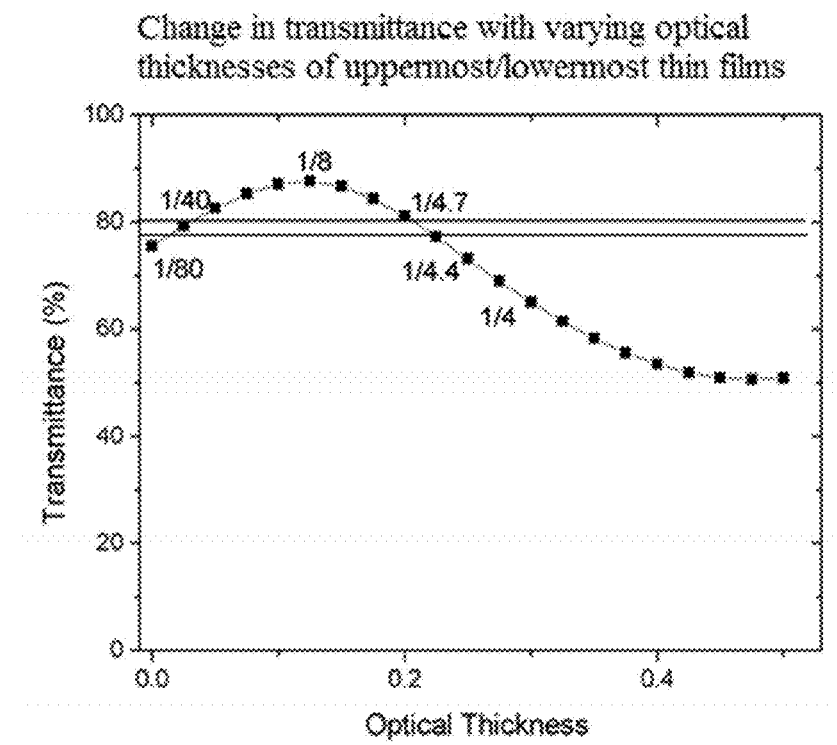
FIG. 2b is a curve showing a change in transmittance with varying optical thicknesses of an uppermost layer and a lowermost layer of the long-wavelength pass filter, and FIG. 2c graphically shows changes in the transmittance of the long-wavelength pass filter with varying optical thicknesses of the uppermost layer and/or the lowermost layer as a function of wavelength.

FIG. 2b is a curve showing a change in the transmittance of the long-wavelength pass filter with varying optical thicknesses of the uppermost layer and the lowermost layer. The curve confirms that as the optical thicknesses of the uppermost layer and/or the lowermost layer approximate 1/8, the transmittance of the long-wavelength pass filter increases noticeably.

Figure 2C:
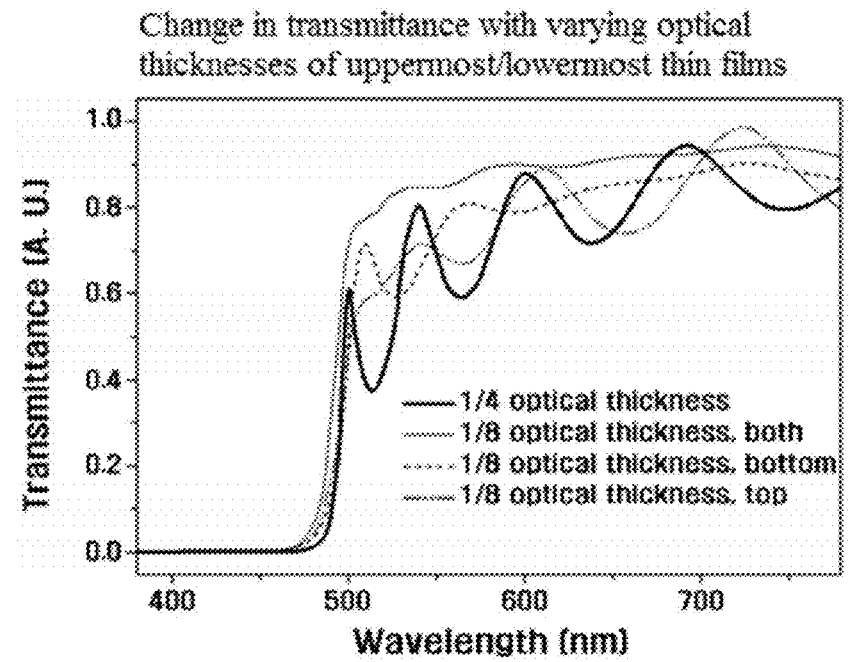

FIG. 2c graphically shows changes in the transmittance of the long-wavelength pass filter with varying optical thicknesses of the uppermost layer and/or the lowermost layer as a function of wavelength. When both the uppermost layer and the lowermost layer have an optical thickness of 1/8 of a wavelength of 500 to 700 nm, the highest transmittance is observed, which is the major purpose to be achieved in the present invention. The transmittances observed when one of the uppermost layer and the lowermost layer has an optical thickness of 1/8 (the other has an optical thickness of 1/4) are higher than those observed when both the uppermost layer and lowermost layer have optical thicknesses of 1/4. However, a strong wavelength-dependent deviation is observed when one of the uppermost layer and the lowermost layer has an optical thickness of 1/8 (the other has an optical thickness of 1/4). From these observations, it can be concluded that when the optical thicknesses of the uppermost layer and the lowermost layer are close to 1/8, the highest efficiency is obtained.

The third thin films may be made of the same material as the second thin films. The optical thicknesses of the uppermost layer and the uppermost layer are different from those of the second thin films and may be from 1/80 to 1/4.4. Alternatively, the optical thickness of one of the uppermost layer and the lowermost layer may be from 1/80 to 1/4.4 and the optical thickness of the other layer may be identical to that (1/4) of the second thin films. The layers adjacent to the third thin films, that is to say, the layer underlying the uppermost layer and the layer overlying the lowermost layer may be the first thin films. Each of the constituent layers (i.e. the first thin films and the second thin films) of the layer stack 101 formed between the uppermost layer and the lowermost layer may have an optical thickness ($\lambda_{max}$/n, n: refractive index of the thin film) corresponding to 1/3 to 1/5, preferably 1/4(hereinafter, also referred to simply as "1/4 wavelength thickness"), of the peak wavelength of the reflection band of blue light. A glass substrate is not shown in FIG. 2a.

According to one embodiment of the present invention, the long-wavelength pass filter may be designed by the transfer-matrix method, which will be described below, for the purpose of reflecting blue light and transmitting light in the wavelength range of 500 to 700 nm, such as yellow light. The first thin films may be made of a material having a relatively low refractive index, for example, silicon oxide ($SiO_2$). The second thin films may be made of a material having a relatively high refractive index, for example, titanium oxide ($TiO_2$).

Figure 3:
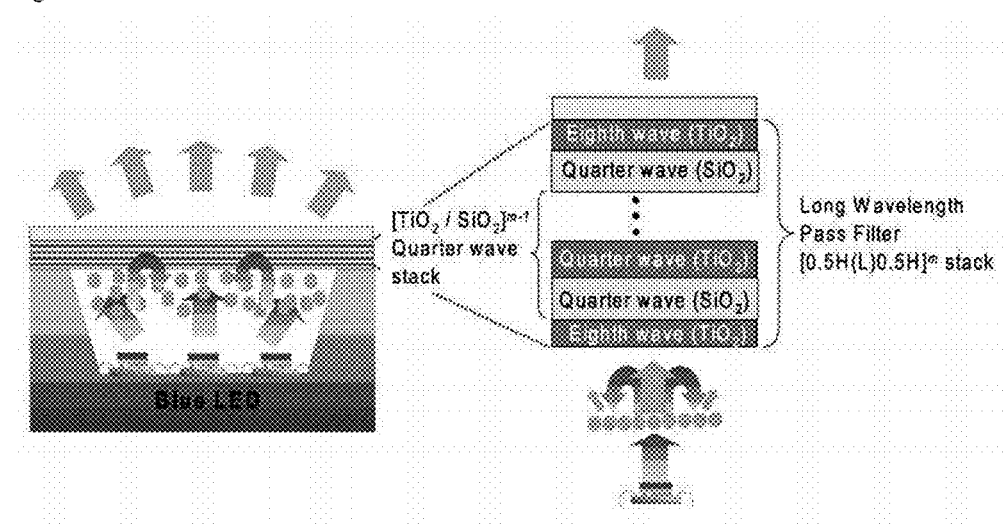
FIG. 3 schematically shows the structure of a phosphor-converted single-color LED of a white LED device according to a preferred embodiment of the present invention.

FIG. 3 schematically shows the structure of a pc-LED of a white LED device according to a preferred embodiment of the present invention. Referring to FIG. 3, the long-wavelength pass filter used in the present invention may have a structure represented by $[0.5H(L)0.5H]^m$. In the formula, 0.5H means a layer having a higher refractive index corresponding to a 1/8 wavelength thickness (for example, $TiO_2$), L means a layer having a lower refractive index corresponding to a 1/4 wavelength thickness (for example, $SiO_2$), and m means the number of repeats. When m is 1, a layer stack (LH) having a 1/4 wavelength thickness is not present and only the layer (L) having a low refractive index is present between the uppermost layer and the lowermost layer. Accordingly, m is preferably an integer of 2 or above. The structure exemplified in FIG. 3 uses $SiO_2$ layers as the first thin films and $TiO_2$ layers as the second thin films, but the present invention is not limited thereto. In FIG. 3, the uppermost layer of the long-wavelength pass filter is a glass substrate.

Figure 4:
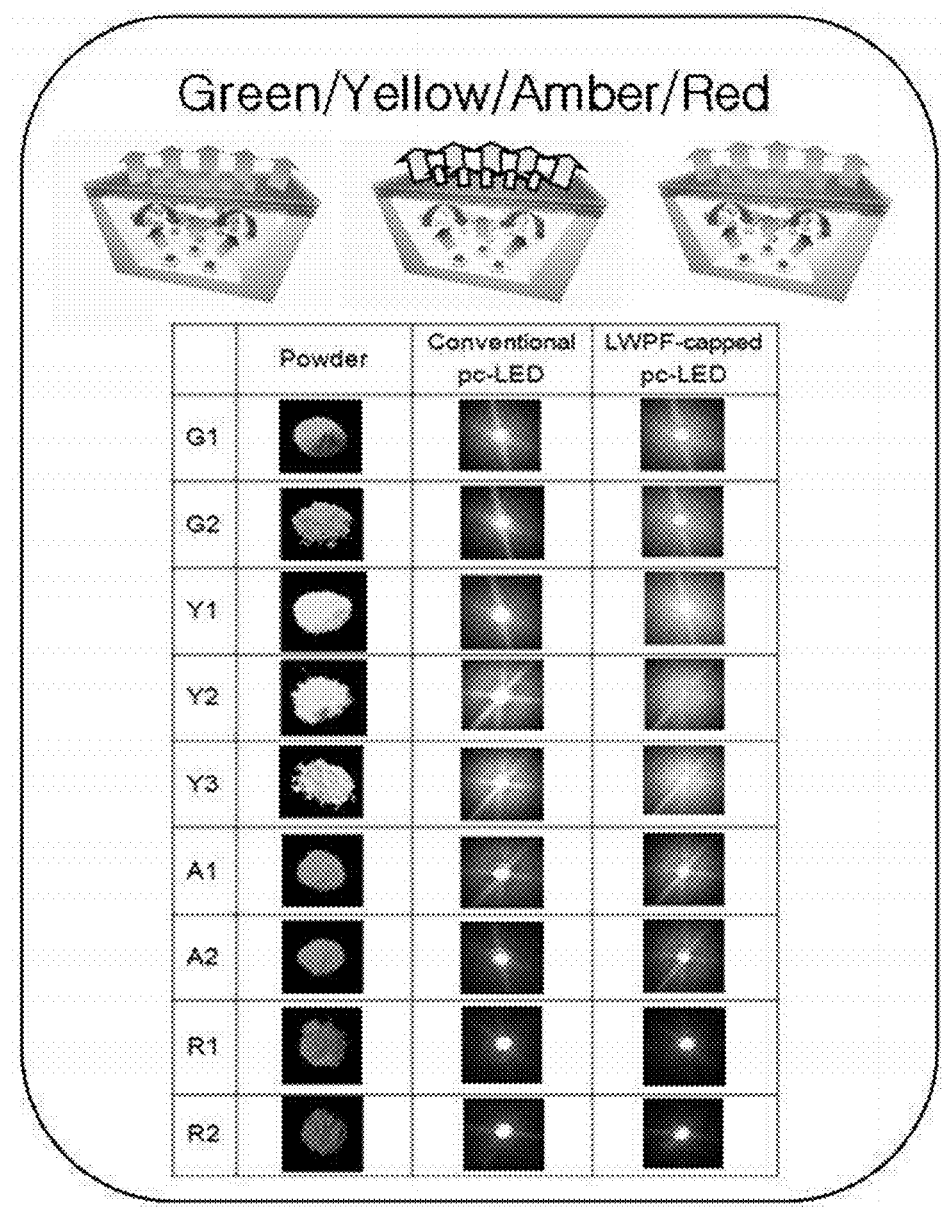
FIG. 4 shows the structures of green/yellow/amber/red phosphor-converted LEDs used in a white LED device of the present invention (top), and emission images of green/yellow/amber/red phosphors, conventional pc-LEDs and long-wavelength pass filter (LWPF)-capped pc-LEDs (bottom).

FIG. 4 shows the structures of green/yellow/amber/red phosphor-converted LEDs used in the white LED device of the present invention (top), and emission images of green/yellow/amber/red phosphors, conventional pc-LEDs and long-wavelength pass filter (LWPF)-capped pc-LEDs (bottom). In FIG. 4, G1 is a $(Sr,Ba)_2SiO_4$:Eu phosphor, G2 is a $(Sr,Ca)Ga_2S_4$:Eu phosphor, Y1 is a $(Sr,Ba)_2SiO_4$:Eu phosphor, Y2 is a $(Sr,Ca)Si_2O_2N_2$:Eu phosphor, Y3 is a $(Y,Gd)_3(Al,Ga)_5O_{12}$:Ce phosphor, A1 is a $(Sr,Ba,Ca)_3SiO_5$:Eu phosphor, A2 is a $(Sr,Ba,Ca)_3SiO_5$:Eu phosphor, R1 is a $(Sr,Ca)AlSiN_3$:Eu phosphor, and R2 is a $CaAlSiN_3$:Eu phosphor. It can be confirmed from the emission images that the introduction of the long-wavelength pass filter greatly improves the color purity of the phosphor-converted single-color LEDs compared to the conventional phosphor-converted single-color LEDs. As a result, the phosphor-converted single-color LEDs emit colors substantially identical to the original colors of the phosphors.

Figure 5:
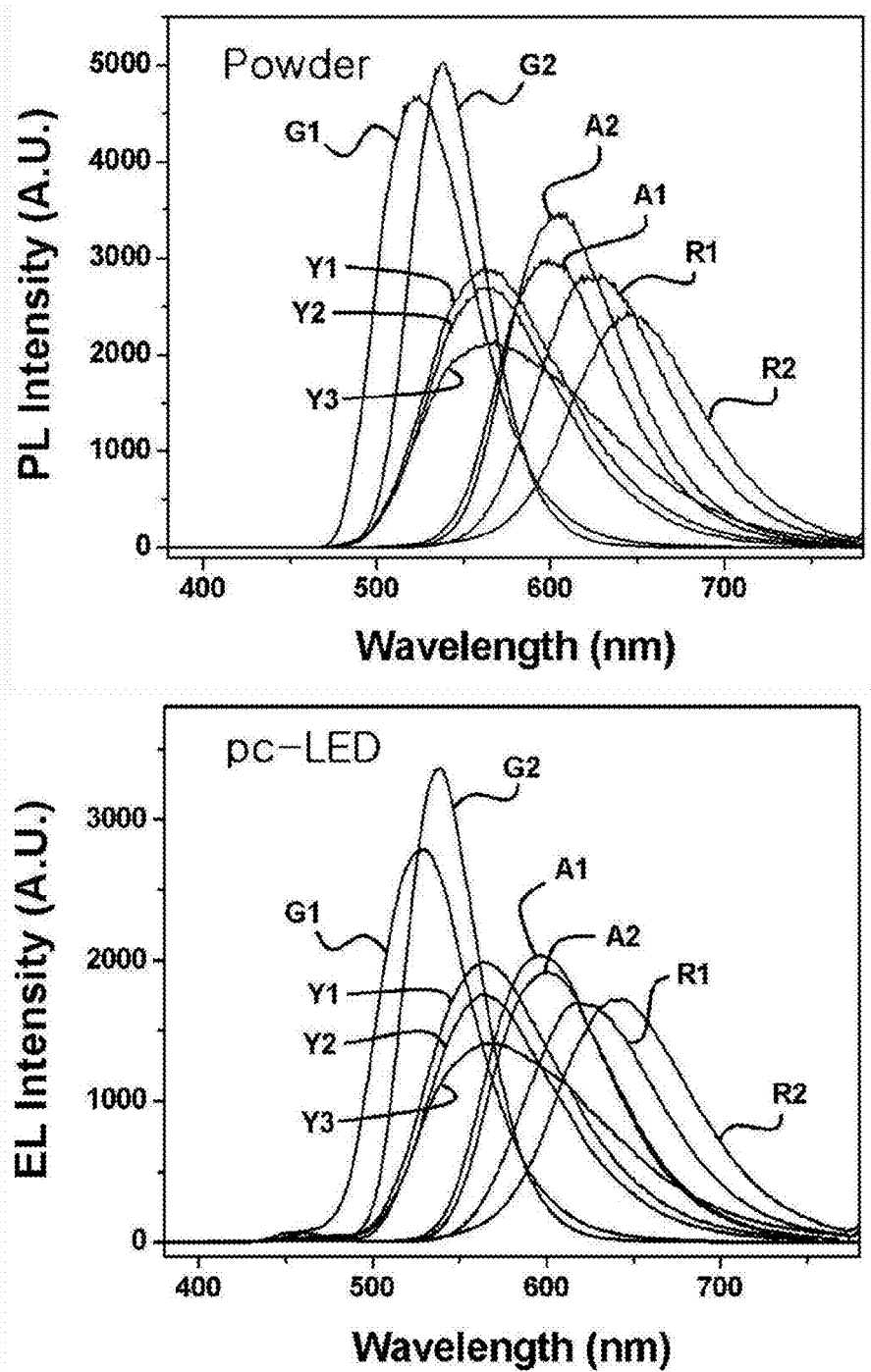
FIG. 5 graphically shows changes in the photoluminescence (PL) intensity of phosphor powders (top) and pc-LEDs (bottom) used in a white LED device of the present invention as a function of wavelength.

FIG. 5 graphically shows the relative photoluminescence (PL) intensities inherent to the phosphor powders (top) as a function of wavelength when excited by blue light of 450 nm and the electroluminescence (EL) intensities of the long-wavelength pass filter-capped pc-LEDs used in the present invention as a function of wavelength (bottom). When comparing the two figures, it can be confirmed that the PL spectra of the phosphors substantially match the EL spectra of the single-color pc-LEDs developed in the present invention, which indicates that the attachment of the long-wavelength pass filter enables the single-color LEDs to emit single colors.

Figure 6:
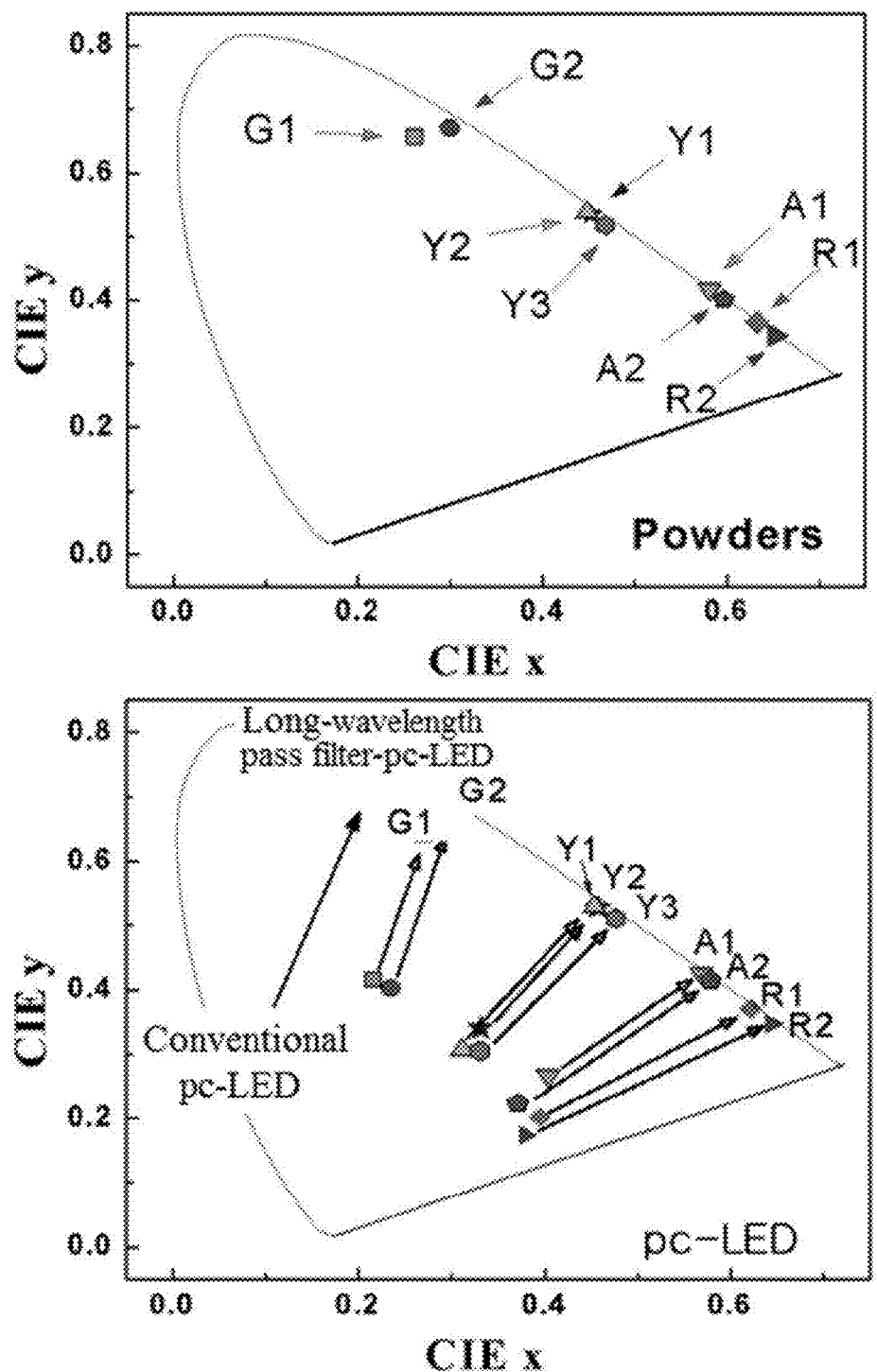
FIG. 6 shows the CIE color coordinates of phosphors (top) and pc-LEDs before and after a long-wavelength pass filter used in a white LED device of the present invention is attached thereto (bottom).

FIG. 6 shows the CIE color coordinates of the phosphors (top), a conventional pc-LED and the long-wavelength pass filter-capped pc-LEDs (bottom). The x- and y-axes show x and y values on the CIE color coordinates, respectively. The x and y coordinates for a certain color mean the purity and kind of the color. From the CIE color coordinates, it can be confirmed that the x and y color coordinates of the phosphors can be exactly realized by the long-wavelength pass filter-capped pc-LEDs.

The EL characteristics of the single-color pc-LEDs including the long-wavelength pass filters are summarized in Table 1. The EL characteristics include relative external quantum efficiency, relative luminous efficacy, luminous efficacy, color purity, and peak wavelength. As can be seen from the results in Table 1, the single-color pc-LEDs including the long-wavelength pass filters exhibit characteristics substantially identical to the luminescent properties of the respective phosphors and high efficiency of the single-color LEDs can be realized by the introduction of the long-wavelength pass filters.

TABLE 1

| | Band edge of long-wavelength pass filter | CIE x | CIE y | Relative external quantum efficiency (%) | Relative luminous efficacy (%) | Luminous efficacy (lm/w) | Color purity | Peak wavelength (nm) |
|---|---|---|---|---|---|---|---|---|
| | Blue LED | 0.16 | 0.02 | 100 | 100 | 5.9 | 99.2 | 446 |
| G-1 | L1 (510 nm) | 0.27 | 0.64 | 71.6 | 1256 | 74.7 | 75.6 | 530 |
| G-2 | L1 (510 nm) | 0.3 | 0.66 | 66.6 | 1425 | 82.7 | 91 | 538 |
| Y-1 | L2 (530 nm) | 0.46 | 0.53 | 71.8 | 1191 | 70.9 | 96.7 | 564 |
| Y-2 | L2 (530 nm) | 0.46 | 0.53 | 60.5 | 1012 | 61.2 | 96.2 | 564 |
| Y-3 | L2 (530 nm) | 0.48 | 0.51 | 65.6 | 951 | 57.8 | 97.8 | 568 |
| A-1 | L2 (530 nm) | 0.57 | 0.43 | 66.6 | 886 | 52.7 | 97.7 | 596 |
| A-2 | L2 (530 nm) | 0.58 | 0.41 | 63.1 | 816 | 48.5 | 97.5 | 602 |
| R-1 | L2 (530 nm) | 0.62 | 0.36 | 61.5 | 492 | 27.7 | 97.1 | 618 |
| R-2 | L2 (530 nm) | 0.63 | 0.34 | 63.6 | 345 | 19.4 | 93.4 | 644 |

Figure 7:
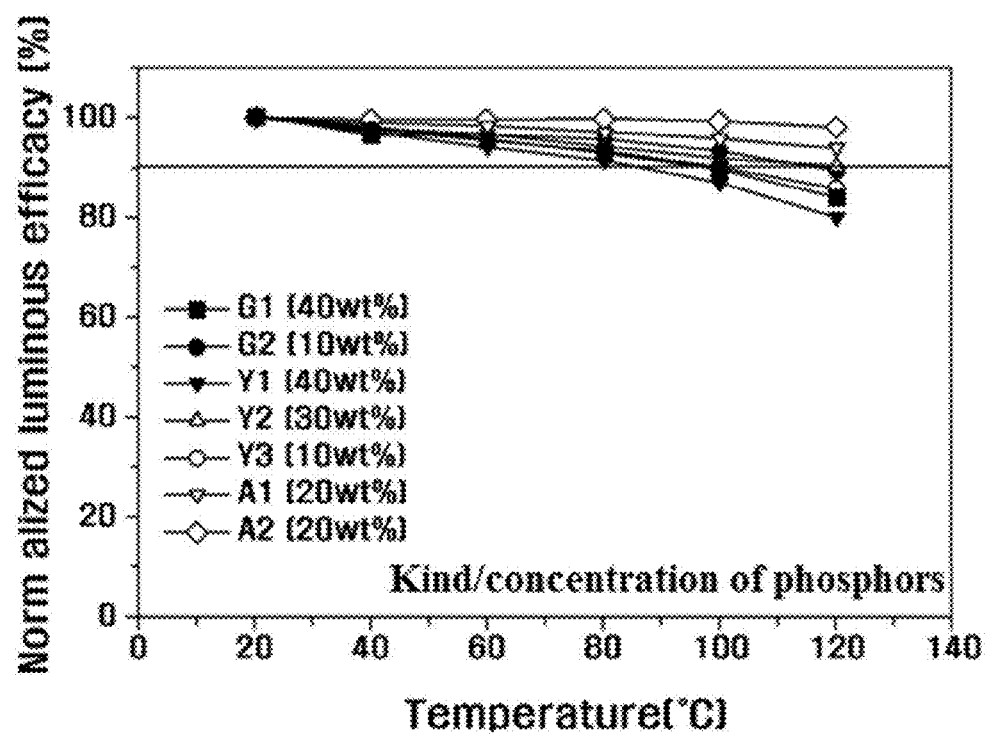
FIG. 7 graphically shows changes in the normalized luminous efficacy of single-color pc-LEDs using different kinds of phosphors as a function of temperature, and FIG. 8 graphically shows changes in the normalized luminous efficacy of a single-color pc-LED using a phosphor at different concentrations as a function of temperature.
Figure 8:
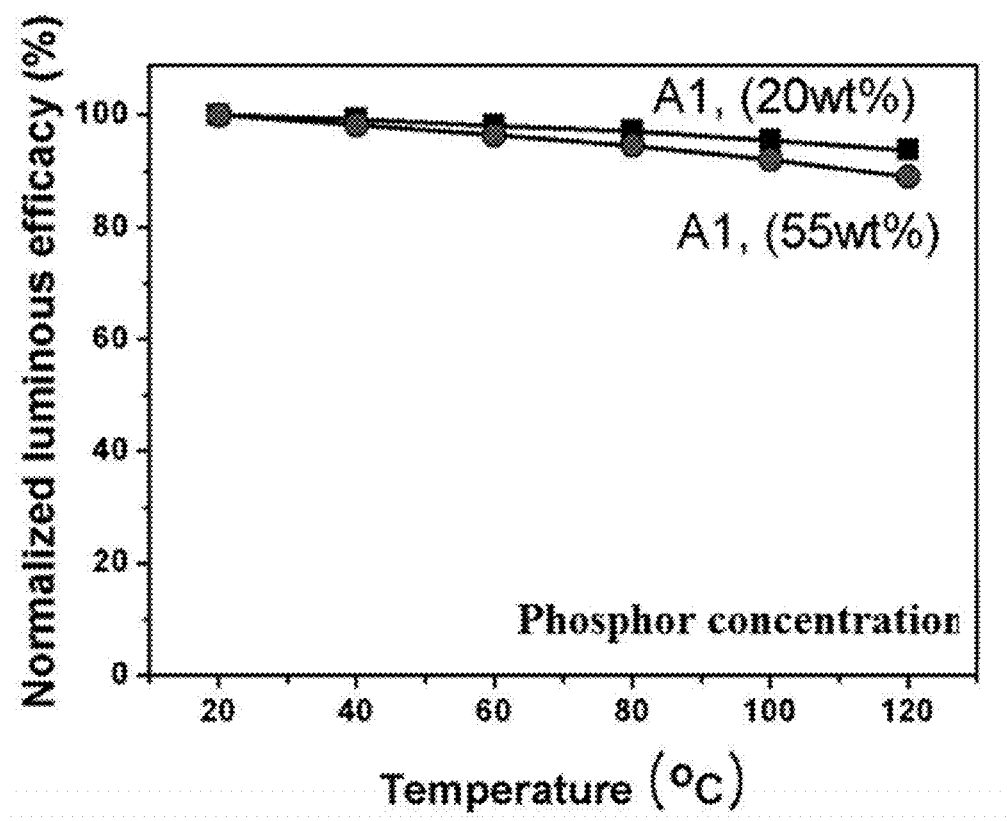

FIG. 7 graphically shows changes in the normalized luminous efficacy of the long-wavelength pass filter-capped single-color pc-LEDs using different kinds of phosphors as a function of temperature. FIG. 8 graphically shows changes in the normalized luminous efficacy of the single-color pc-LED using a phosphor at different concentrations as a function of temperature. Although a phosphor is excited by a blue LED to realize a single-color LED, there is a slight difference in temperature decay characteristics depending on the kind of the phosphor. At an actual operating temperature of 80° C., the efficiency drops within 90%. Accordingly, conventional red and green LEDs undergo efficiency losses of 50% and 75%, respectively, every time the temperature increases by 80° C. In conclusion, the efficiency characteristics of the phosphor-converted single-color LED of the white LED device of present invention can be maintained very stably against a change in ambient temperature when compared to conventional single-color LEDs. In addition, a white LED lamp including the long-wavelength pass filter-capped single-color pc-LED can be expected to have stable temperature characteristics.

Figure 9:
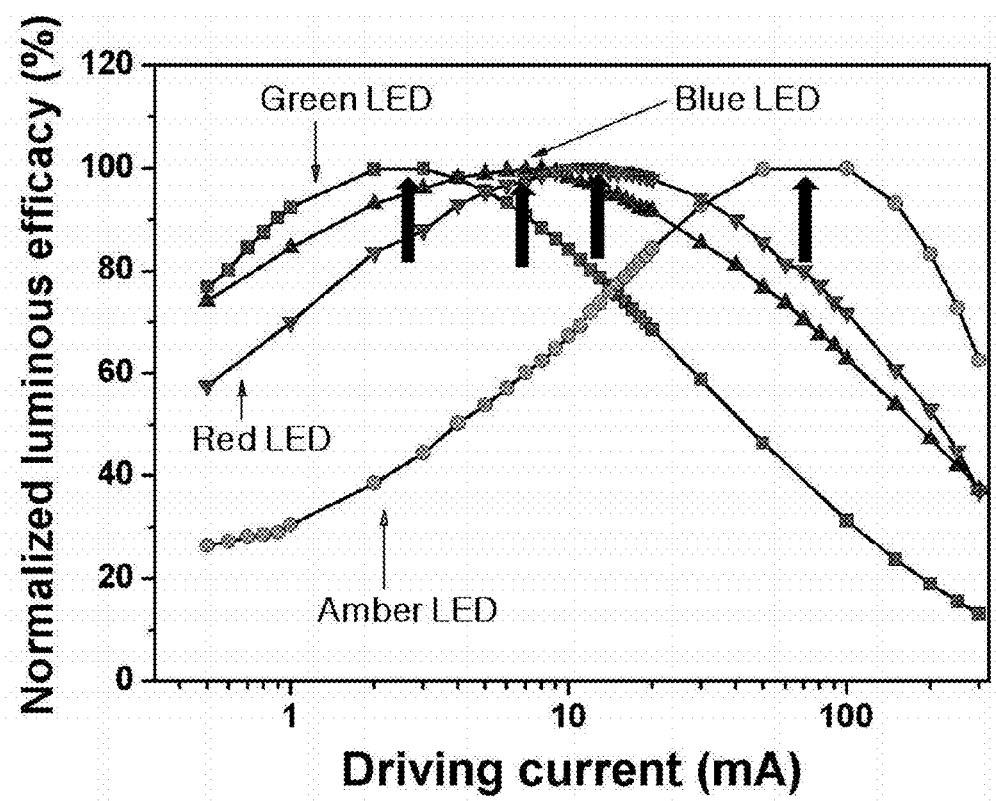
FIG. 9 graphically shows changes in the normalized luminous efficacy of conventional single-color LEDs using different kinds of phosphors as a function of driving current, FIG. 10 graphically shows changes in the normalized luminous efficacy of single-color pc-LEDs using different kinds of phosphors in a white LED device according to the present invention as a function of driving current.

FIG. 9 graphically shows changes in the normalized luminous efficacy of InGaN green and blue LEDs and InGaAlP amber and red LEDs as conventional single-color LEDs as a function of driving current. The arrows in FIG. 9 indicate droop points of the phosphors. As can be seen from the graph, the locations of the droop points of the phosphors in the conventional single-color LEDs relative to the applied driving currents are different. Accordingly, when it is intended to manufacture a multi-chip white LED including the conventional single-color LEDs, a complicated driving circuit is needed to match the droop points.

Figure 10:
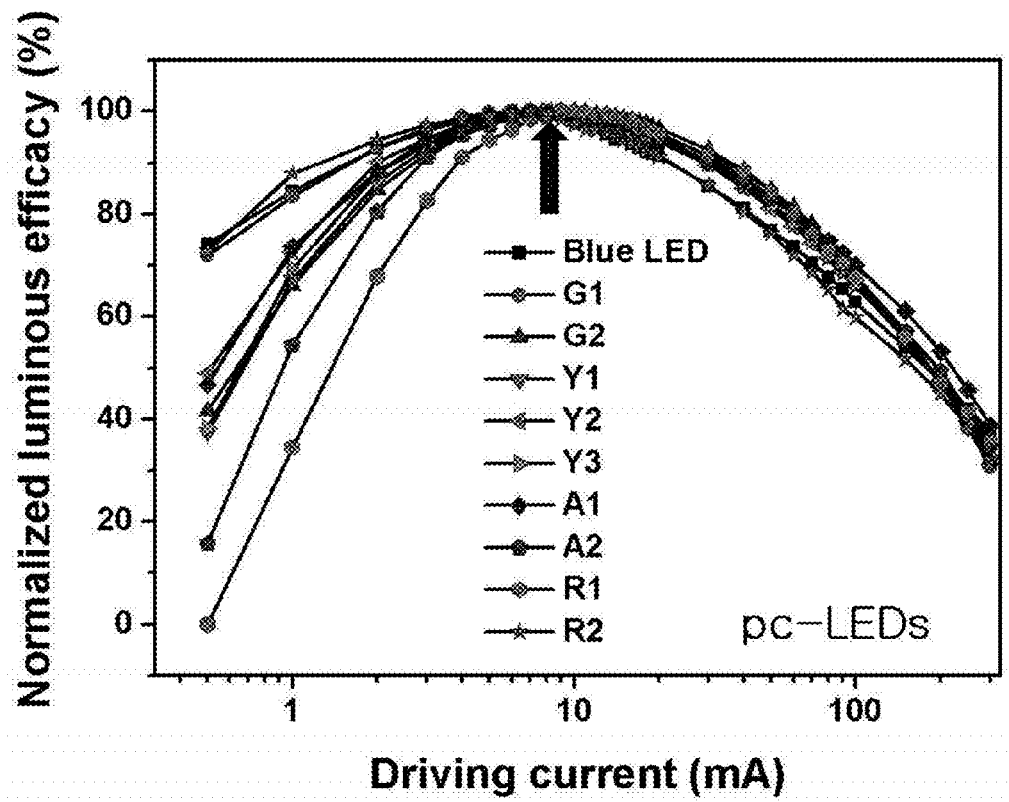

In contrast, FIG. 10 shows changes in the normalized luminous efficacy of long-wavelength pass filter-capped single-color pc-LEDs using different kinds of phosphors as a function of driving current. It can be confirmed from the graph that the locations of the droop points of the phosphors are almost identical relative to the applied driving currents. From these results, it can be concluded that a driving circuit having a simple structure can be used to allow a multi-package LED including long-wavelength pass filter-capped single-color pc-LEDs according to the present invention to emit white light because the locations of the droop points of the phosphors are almost identical relative to the applied driving currents.

Figure 11:
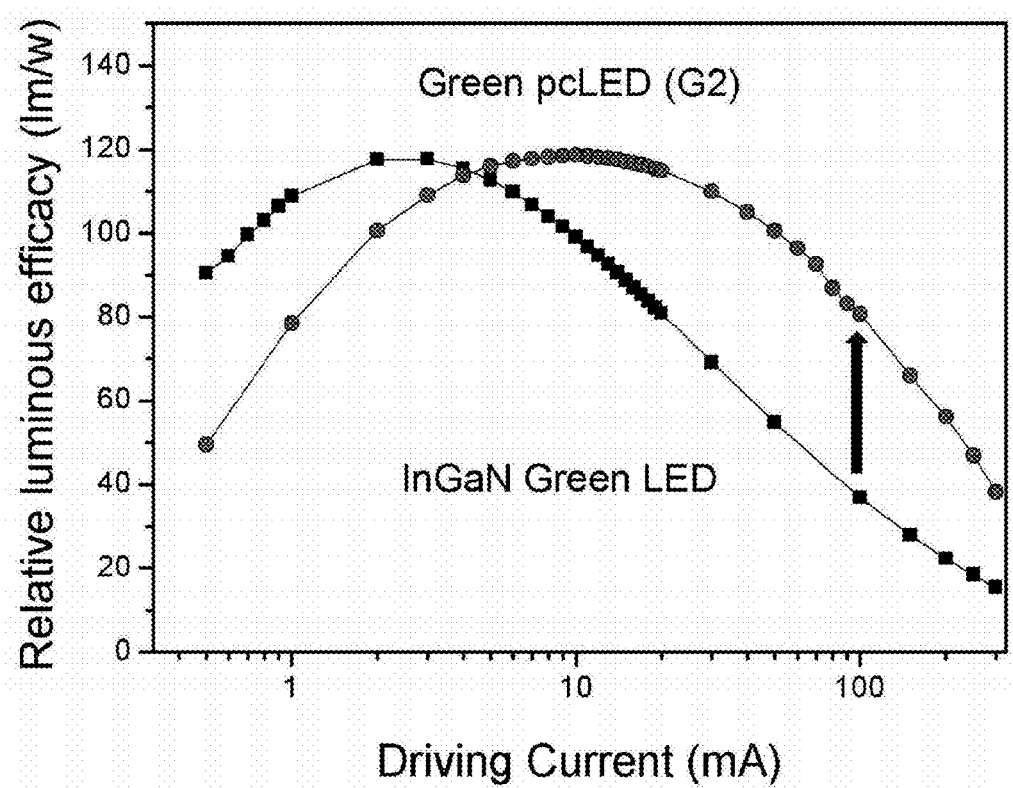
FIG. 11 graphically shows changes in the relative luminous efficacy of a conventional green LED and a green pc-LED including a long-wavelength pass filter as a function of driving current, FIG. 12 graphically shows changes in the relative luminous efficacy of a conventional amber LED and a green pc-LED including a long-wavelength pass filter as a function of driving current.
Figure 12:
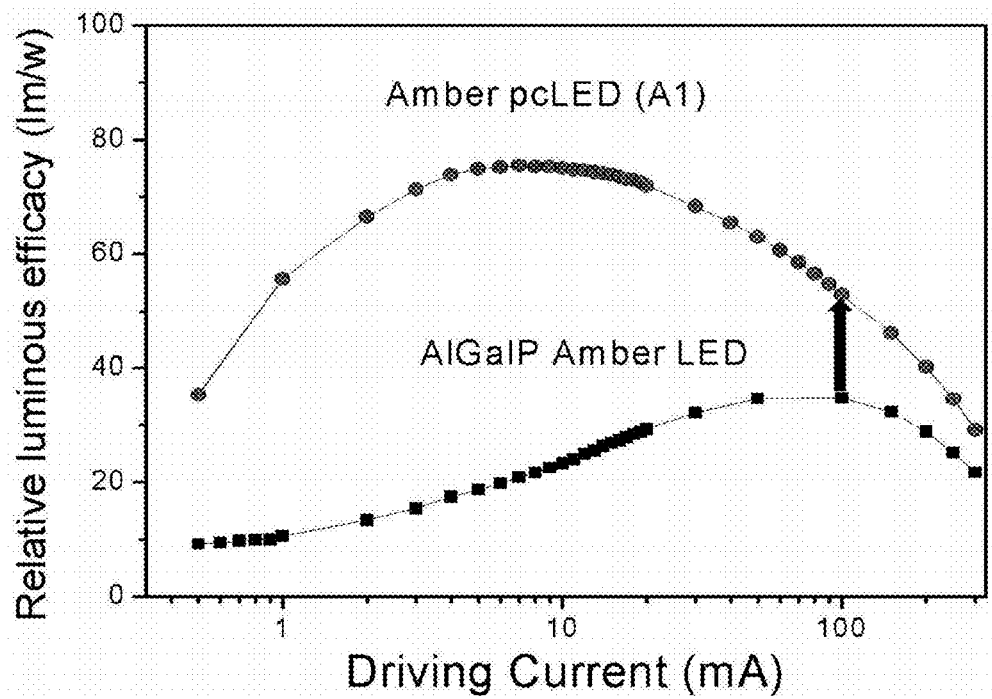

FIG. 11 graphically shows changes in the relative luminous efficacy of a conventional green LED and the green pc-LED including the long-wavelength pass filter as a function of driving current. FIG. 12 graphically shows changes in the relative luminous efficacy of a conventional amber LED and the green pc-LED (G2) including the long-wavelength pass filter as a function of driving current. In FIG. 11, the relative luminous efficacies of the conventional green LED and the green pc-LED are 36.9 lm/w and 82.7 lm/w, respectively, at 100 mA, which is a widely employed current for driving. The relative luminous efficacy of the green pc-LED is 2.24 times higher than that of the conventional green LED. In FIG. 12, the relative luminous efficacies of the conventional amber LED and the amber pc-LED (A1) are 34.7 lm/w and 52.9 lm/w, respectively, at 100 mA. The relative luminous efficacy of the amber pc-LED is 1.52 times higher than that of the conventional amber LED.

At least one package of the plurality of single-color LED packages constituting the multi-package white LED device according to one preferred embodiment of the present invention is selected from the phosphor-converted single-color LEDs described above. In comparison with conventional white LED devices using RGB multi-chips, the multi-package white LED device of the present invention maximizes the efficiency of a green LED in the yellow gap to minimize a deviation in performance between the other color chips. In addition, deviations in temperature, current and droop characteristics between the constituent chips can be minimized, contributing to the simplification of a driving circuit. Therefore, the multi-package white LED device of the present invention is suitable for commercialization.

Furthermore, the multi-package white LED device of the present invention has a higher color rendering index ($R_a$)

(>80) than conventional white LED devices having single-package structures. The correlated color temperatures of the multi-package white LED device of the present invention are controllable in the range of 2,700 to 12,000 K. When the multi-package white LED device of the present invention is used as a conventional lighting device, it can express abundant emotional colors and can emit white light with high efficiency.

On the other hand, the multi-package white LED device of the present invention has the same constitution as conventional white LED devices using RGB multi-chips except that at least one chip of the plurality of single-color LED chips is selected from the phosphor-converted single-color LEDs described above. The sizes, materials, arrangements, etc. of the single-color LED packages are the same as those of conventional white LED devices using RGB multi-chips, and their detailed description is thus omitted. The blue chip used in the multi-package white LED device of the present invention has a size of 1 mm×0.5 mm and a cup including the chip and the phosphor has a size of 50 mm×50 mm, but are not limited to these sizes. It will be obvious to those skilled in the art that the sizes of the blue chip and the cup may be appropriately varied depending on the intended applications and the conditions of use.

The present invention will be explained in more detail based on the following examples. However, these examples are given for illustrative purposes only and are not intended to limit the scope of the invention.

Fabrication Example 1

Fabrication of Phosphor-Converted Single-Color LEDs

Referring to the methods described in Example 1 of Korean Patent Application No. 2010-34745 entitled "Phosphor-converted single-color LED including long-wavelength pass filter", phosphor-converted single-color LEDs emitting different colors were fabricated.

(1) Phosphor-Converted Red LED ($R_{B,M}$)

Specifically, 10 wt % of $(Sr,Ca)AlSiN_3$:Eu as a red phosphor R1 was mixed with a silicone binder, the mixture was injected into a cup including a blue LED (external quantum efficiency=0.34, 13 mW, Dongbu LED), followed by drying at 100° C. for 3 hr to fabricate a phosphor-converted red LED, $R_{B,M}$. Thereafter, long-wavelength pass filters A1, A2 and A3 were produced in accordance with the methods described in Korean Patent Application No. 2010-34745. Specifically, $TiO_2$ was deposited to a thickness (A2: 24 nm) corresponding to ⅛ of the peak wavelength of the reflection band of blue light by e-beam deposition to form an uppermost layer and a lowermost layer. $SiO_2$ and $TiO_2$ were repeatedly deposited to thicknesses (A1: 69/46 nm, A2: 72/48 nm, A3: 73/50 nm) corresponding to ¼ of the peak wavelength of the reflection band of blue light by e-beam deposition at 250° C. to form first thin films and second thin films. In the long-wavelength pass filter A2, the peak wavelength of the reflection band in the blue region was 446 nm. Specifically, the long-wavelength pass filter A2 was produced by depositing $TiO_2$ to a thickness of 24 nm (⅛ optical thickness) to form a lowermost layer, depositing eight units, each consisting of a first thin film and a second thin film, depositing $SiO_2$ thereon to form a first thin film layer (69 nm), and depositing $TiO_2$ to a thickness of 24 nm to form an uppermost layer. The pressure of a beam chamber for deposition was adjusted to $4.0 \times 10^{-5}$ torr and the deposition was conducted at an accelerated voltage of 7 kV under an oxygen partial pressure of $1.9 \times 10^{-4}$ torr.

Thereafter, the long-wavelength pass filter (band edge=530 nm) was cut to a size corresponding to that of the cup and attached to the front side of the LED cup. The size of the blue chip was 1 mm×0.5 mm, and the size of the cup including the chip and the phosphor was 50 mm×50 mm.

(2) Phosphor-Converted Amber LED ($A_{B,M}$)

A phosphor-converted amber LED ($A_{B,M}$) was fabricated in the same manner as in Fabrication Example 1, except that $(Sr,Ba,Ca)_3SiO_5$:Eu (596 nm, Intemetix) as an amber phosphor A1 was used at a concentration of 20 wt % instead of the red phosphor.

(3) Phosphor-Converted Green LED ($G_{B,M}$)

A phosphor-converted green LED ($G_{B,M}$) was fabricated in the same manner as in Fabrication Example 1, except that $(Sr,Ba)_2SiO_4$:Eu (Intemetix) as a green phosphor G1 was used instead of the red phosphor.

(4) Conventional Phosphor-Converted White LED ($W_B$)

A blue LED-excited white LED emitting both blue light and yellow light was used as a conventional phosphor-converted white LED, $W_B$. In the conventional phosphor-converted white LED, $(Y,Gd)_3(Al,Ga)_5O_{12}$:Ce (Phosphor Tech) was included as a yellow phosphor Y3 but no long-wavelength pass filter was used. That is, the phosphor-converted red LED ($R_{B,M}$) included a red phosphor, the phosphor-converted amber LED ($A_{B,M}$) included an amber phosphor, the phosphor-converted green LED ($G_{B,M}$) included a green phosphor, and the conventional phosphor-converted white LED ($W_B$) included a yellow phosphor to emit both blue light and yellow light. B is a conventional InGaN-based blue LED, R is a conventional InGaAlP-based red LED, and G is a conventional InGaN-based green LED. The conventional red, green and blue LEDs (R, G and B) mean LEDs that use only semiconductor chips without using phosphors and long-wavelength pass filters. They were purchased from ALTI semiconductor Co., Ltd. (currently Dongbu LED). The green and red LEDs were comparable to the blue LED in terms of performance.

Example 1

Manufacture of Multi-Package White LED Devices

Figure 13:
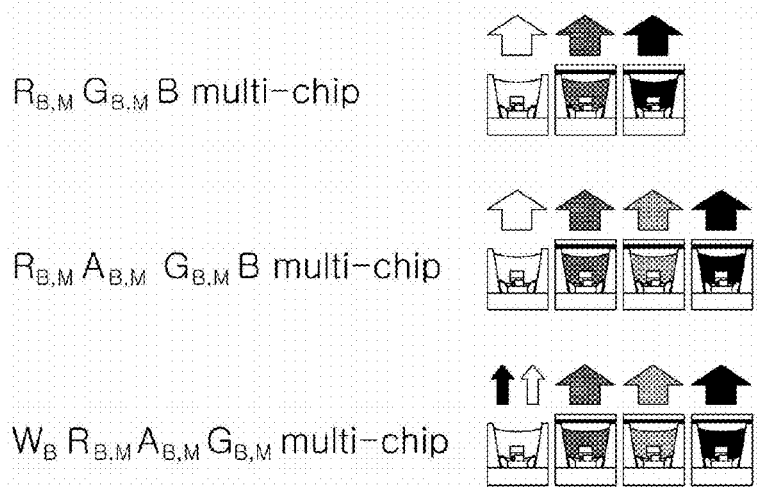
FIG. 13 shows multi-package white LED devices including phosphor-converted single-color LEDs capable of white light emission according to embodiments of the present invention.
Figure 14:
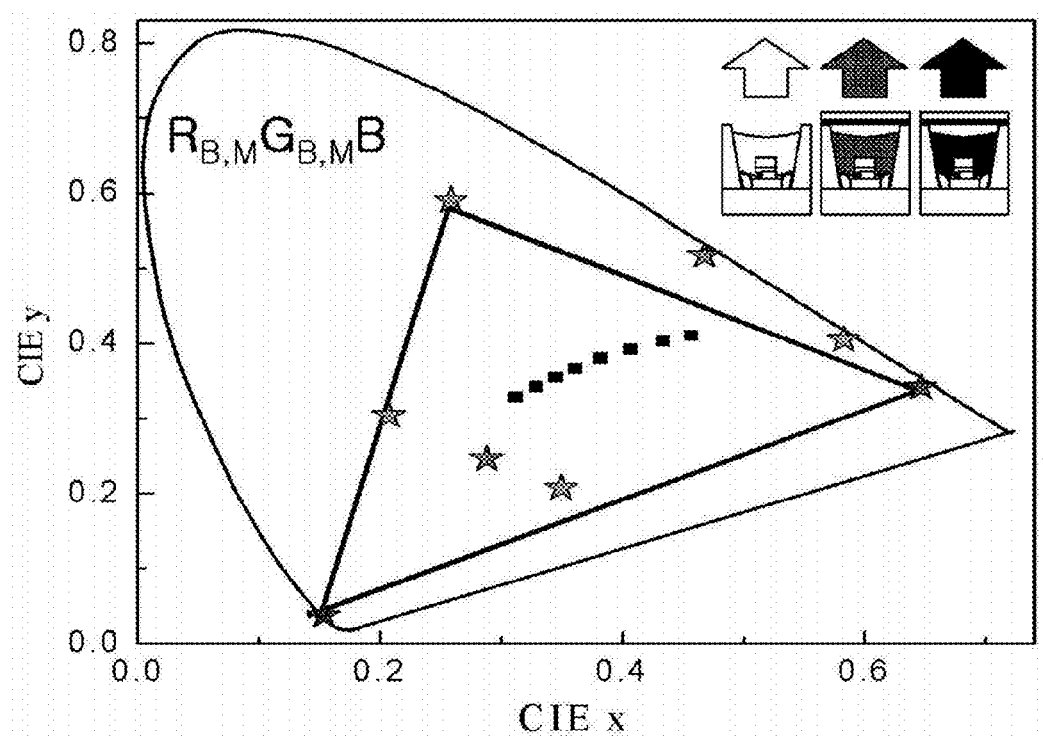
FIGS. 14 to 17 show the entire color regions of multi-package white LED devices according to preferred embodiments of the present invention: specifically.

The LEDs of Fabrication Example 1 were combined to manufacture various kinds of multi-package white LED devices. FIG. 13 shows multi-package white LED devices including phosphor-converted single-color LEDs according to embodiments of the present invention. Specifically, the RB,MGB,MB multi-package was manufactured by combining the RB,M, GB,M and B LEDs of Fabrication Example 1.

Specifically, the $R_{B,M}G_{B,M}B$ multi-package was manufactured by joining the $R_{B,M}$, $G_{B,M}$ and B LEDs onto electrodes arranged at the corners of a triangle whose sides are 1 cm long by soldering. Each of the $R_{B,M}A_{B,M}G_{B,M}B$ LED multi-package and $W_B,R_{B,M}A_{B,M}G_B$ LED multi-package was manufactured by joining the single-color package LEDs onto electrodes arranged at the corners of a square whose sides are 1 cm long by soldering. The multi-package white LED device of the present invention is not limited to the multi-package structures shown in FIG. 13, that is, the $R_{B,M}G_{B,M}B$ multi-package, the $R_{B,M}A_{B,M}G_{B,M}B$ multi-package, and the $W_B,R_{B,M}A_{B,M}G_B$ multi-package without a conventional blue LED. The multi-package white LED device may have any combination that includes at least one single-color pc-LED including a long-wavelength pass filter.

Figure 15:
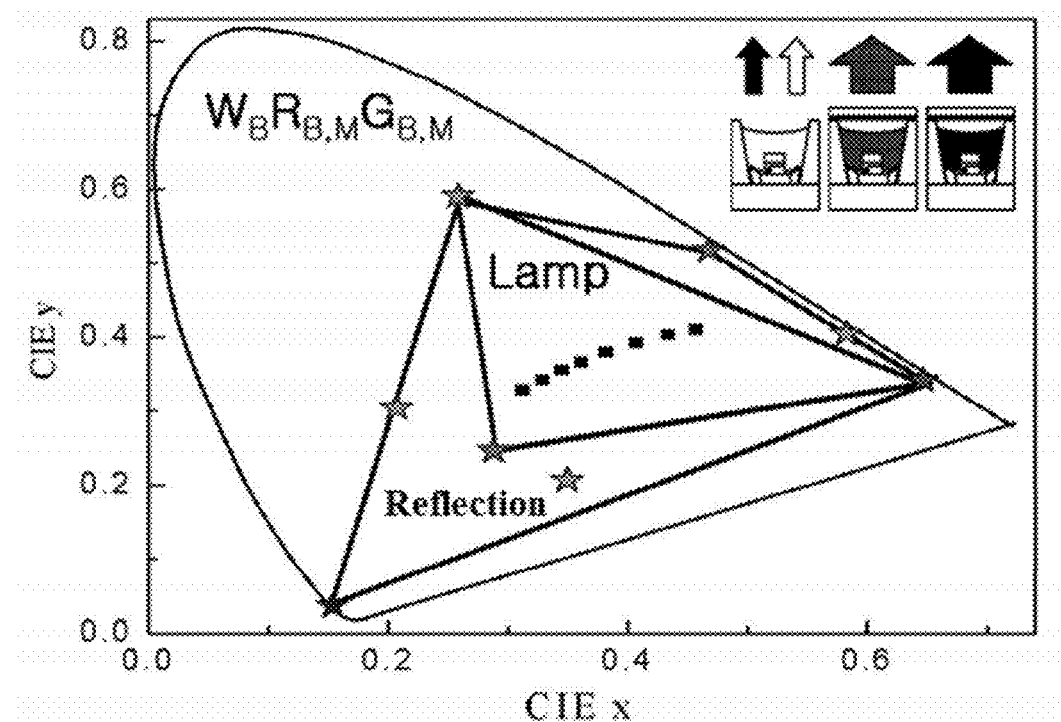
Figure 16:
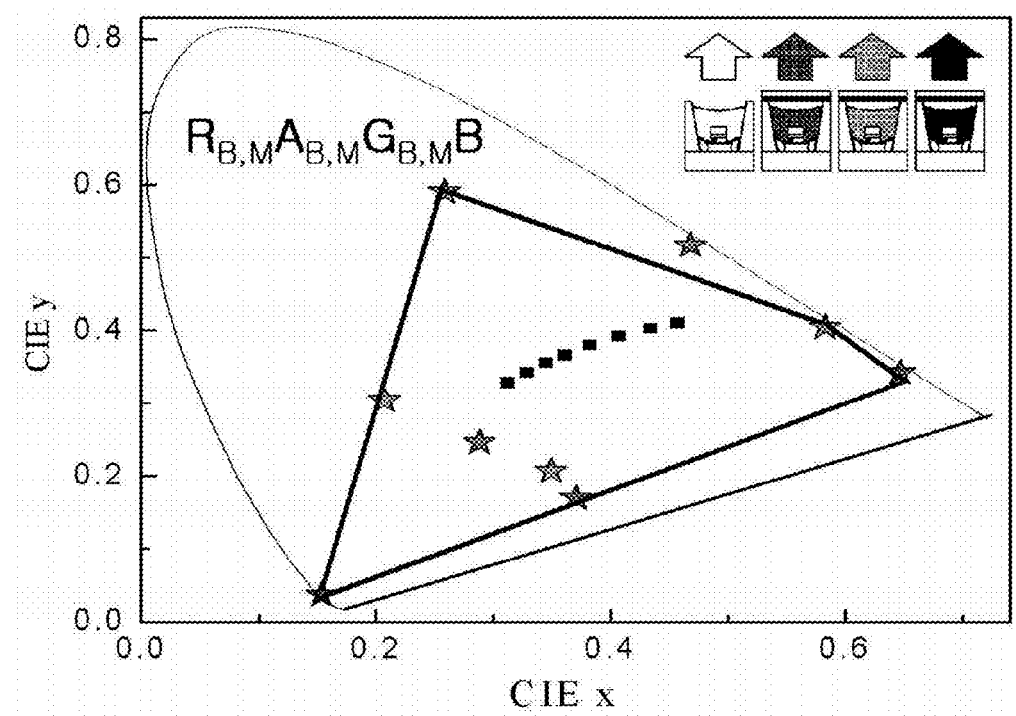
Figure 17:
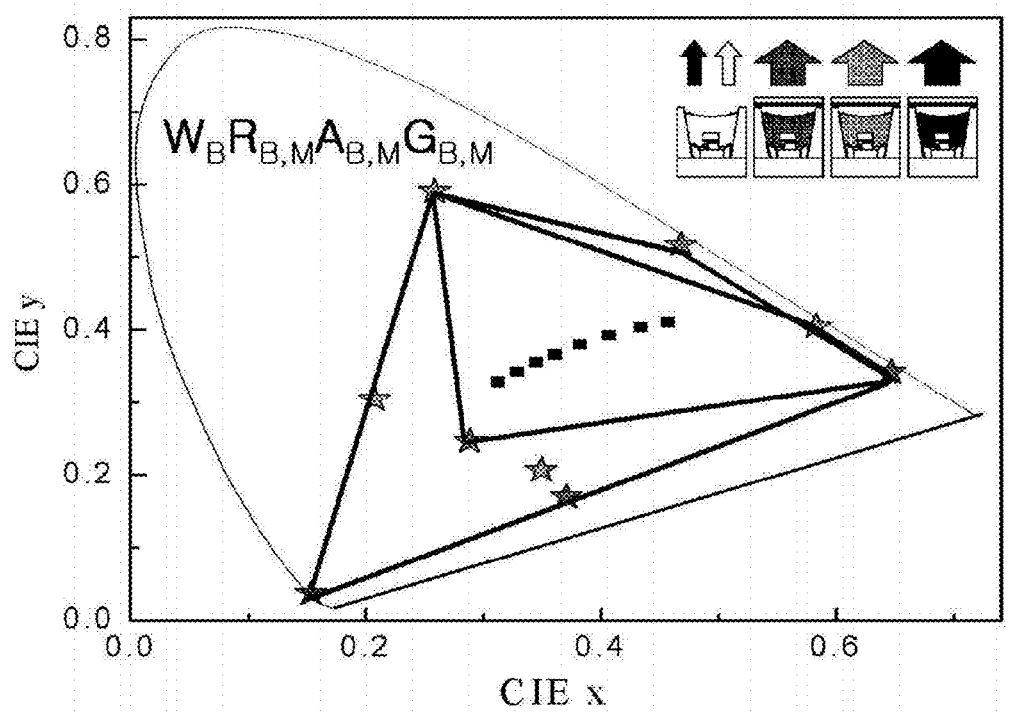

FIGS. 14 to 17 show the entire color regions of multi-package white LED devices according to preferred embodiments of the present invention. Specifically, FIGS. 14 to 17 show the color reproduction ranges of $R_{B,M}G_{B,M}B$ LED, $W_BR_{B,M}G_{B,M}$ LED, $W_BR_{B,M}A_{B,M}B$ LED and $W_BR_{B,M}A_{B,M}G_{B,M}$ LED multi-packages, respectively. In the graphs, the x- and y-axes indicate x and y values of the CIE color coordinates, respectively, and the asterisks for the respective colors indicate the EL emission color coordinates of the single-color pc-LEDs including long-wavelength pass filters. The quadrangles in FIGS. 14 and 16 indicate color reproduction ranges that can be realized by the emission and reflection spectra of lamps. In FIGS. 15 and 17, the quadrangles indicate color reproduction ranges that can be realized by the emission spectra of lamps, and the triangles indicate color reproduction ranges that can be realized by the reflection spectra of lamps. Accordingly, the color reproduction range of the multi-package white LED device of the present invention is dependent on the color coordinates of the single-color pc-LED including the long-wavelength pass filter. Depending on the choice of the single-color pc-LED, user-centered smart lighting capable of producing various colors is possible.

Comparative Example 1

Manufacture of Conventional White LED Device Composed of RGB Multi-Chip

A conventional white LED device composed of an RGB multi-chip including no phosphor-converted LED was fabricated. Specifically, the conventional white LED device composed of an RGB multi-chip was manufactured by assembling the R, G and B LEDs of Fabrication Example 1 in the same manner as in Example 1.

Figure 18:
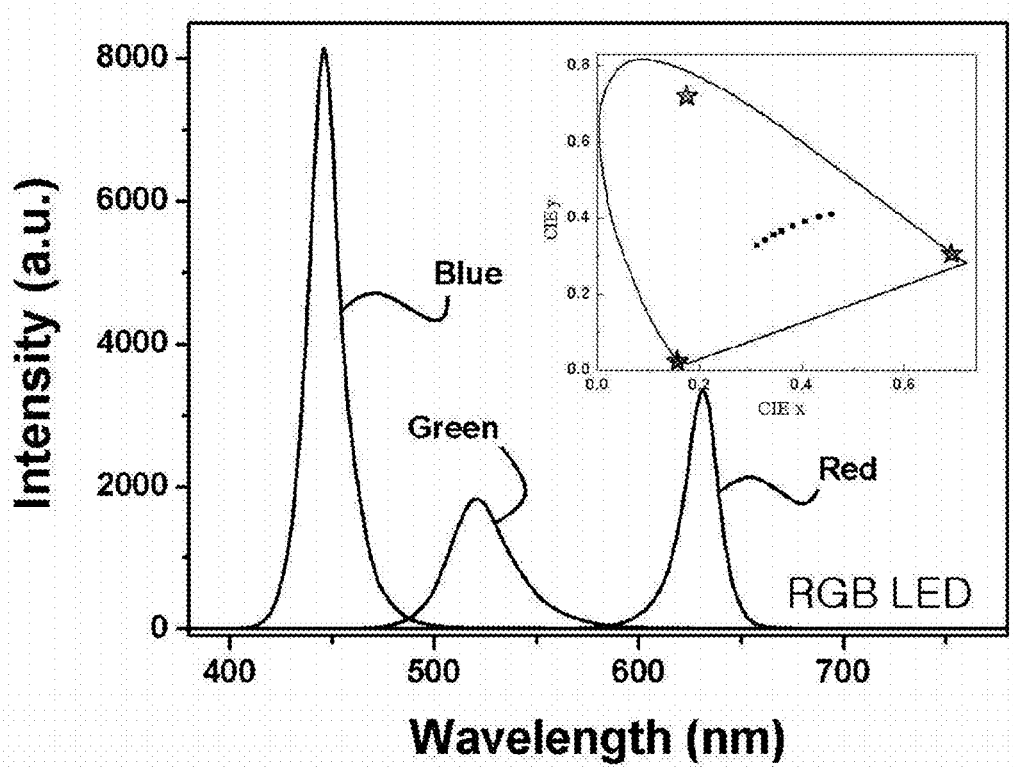
FIGS. 18 to 21 graphically show the physical properties of a conventional white LED device composed of an RGB multi-chip: specifically.
Figure 19:
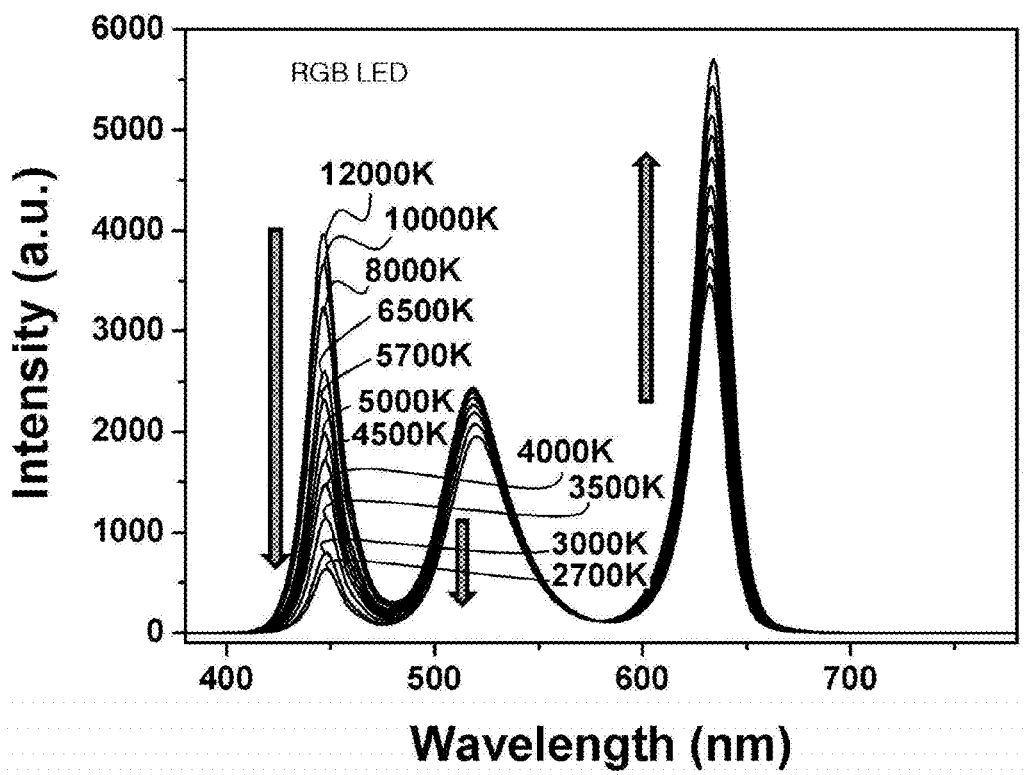

FIGS. 18 to 21 graphically show the physical properties of the conventional white LED device composed of an RGB multi-chip including no phosphor-converted LED. Specifically, FIG. 18 shows changes in light intensity as a function of wavelength. The inset in FIG. 18 shows the color coordinates of the single-color LEDs. FIG. 19 shows changes in light intensity at different correlated color temperatures as a function of wavelength. The graph shows that the conventional white LED device composed of an RGB multi-chip can emit white light with various correlated color temperatures.

Figure 20:
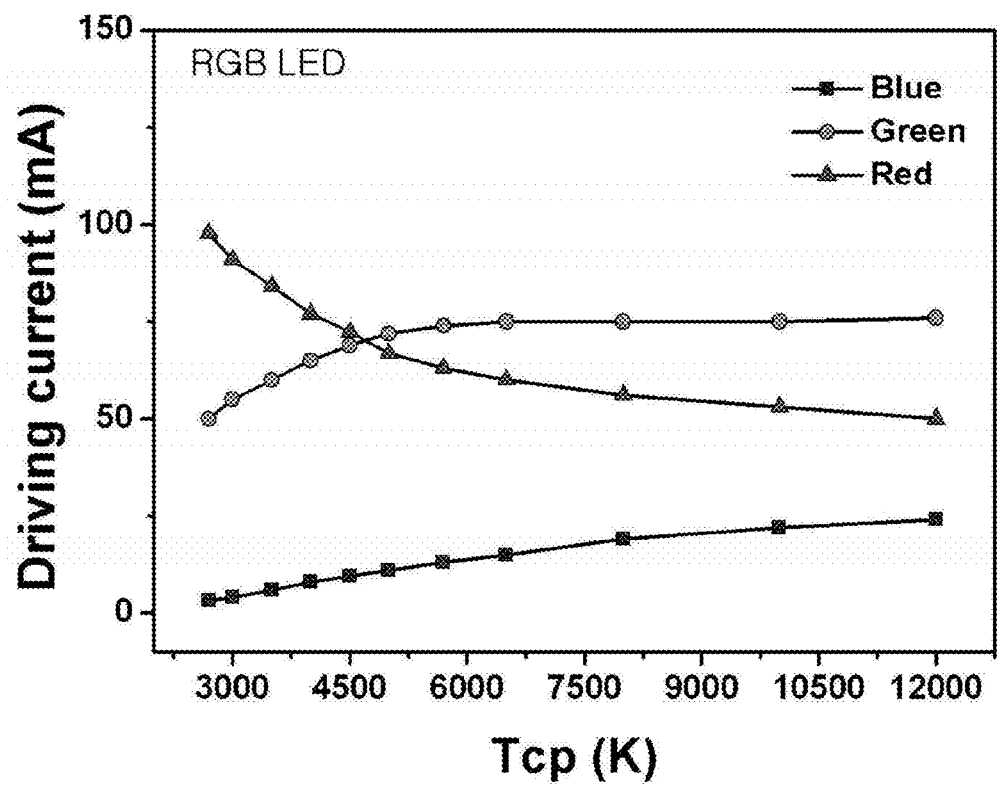
Figure 21:
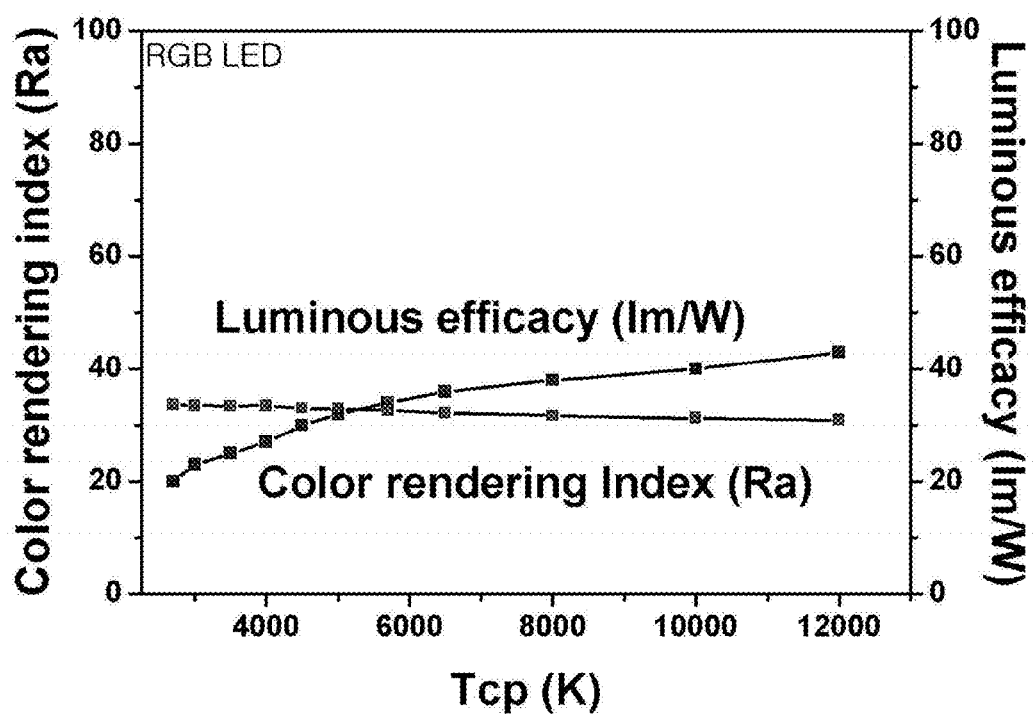

FIG. 20 shows changes in the driving current of the single chips as a function of correlated color temperature (Tcp), and FIG. 21 shows changes in color rendering index ($R_a$) and luminous efficacy as a function of correlated color temperature (Tcp). Various correlated color temperatures can be realized in response to changes in the amount of current applied to the RGB chips, but a complex circuit (although not shown in the figures) is needed to operate the white LED device because changes in the voltages applied to the single-color LEDs are varied depending on the LED colors, resulting in an increase in the construction cost of the driving circuit. Further, the full widths at half maximum (FWHM) of the emission spectra of the RGB single-color chips are small, indicating low color rendering index of the white LED device. The efficiency of the conventional green LED deteriorates, resulting in low efficiency of the white LED device.

Experimental Example 1

Evaluation of Optical Properties of the $R_{B,M}G_{B,M}B$ Multi-Package

Figure 22:
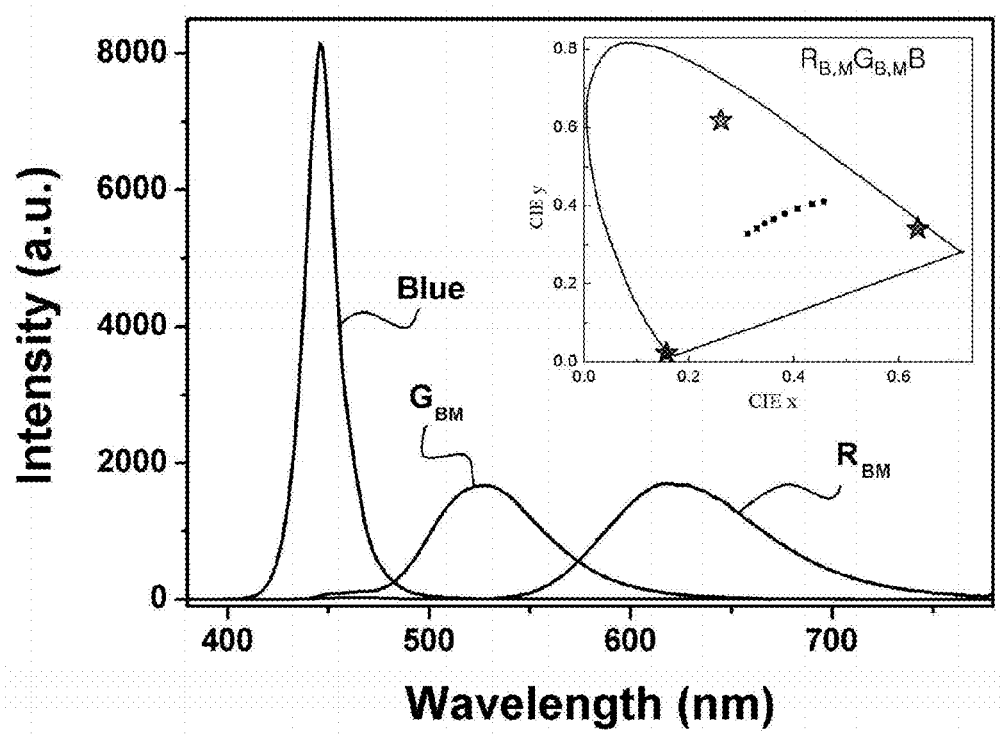
FIGS. 22 to 25 graphically show the physical properties of a white LED device composed of an $R_{B,M}G_{B,M}B$ multi-package according to the present invention: specifically.
Figure 23:
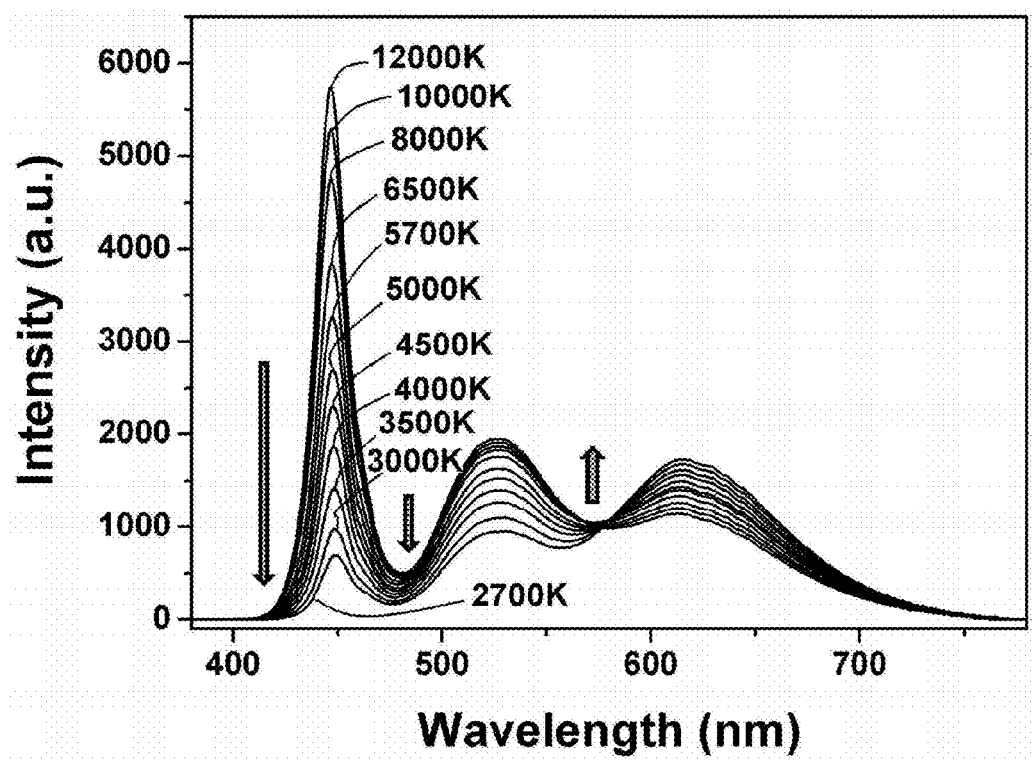

The optical properties of the $R_{B,M}G_{B,M}B$ multi-package manufactured in Example 1 were evaluated. FIGS. 22 to 25 graphically show the physical properties of the white LED device composed of the $R_{B,M}G_{B,M}B$ multi-package. $R_{B,M}$ and $G_{B,M}$ are the R1 and G1 pc-LEDs, respectively. Specifically, FIG. 22 shows changes in light intensity as a function of wavelength. The inset in FIG. 22 shows the color coordinates of the single-color LEDs. FIG. 23 graphically shows changes in light intensity at different correlated color temperatures as a function of wavelength. The graph shows that the white LED device composed of the $R_{B,M}G_{B,M}B$ multi-package can emit white light with various correlated color temperatures, like the conventional white LED device composed of an RGB multi-package.

Figure 24:
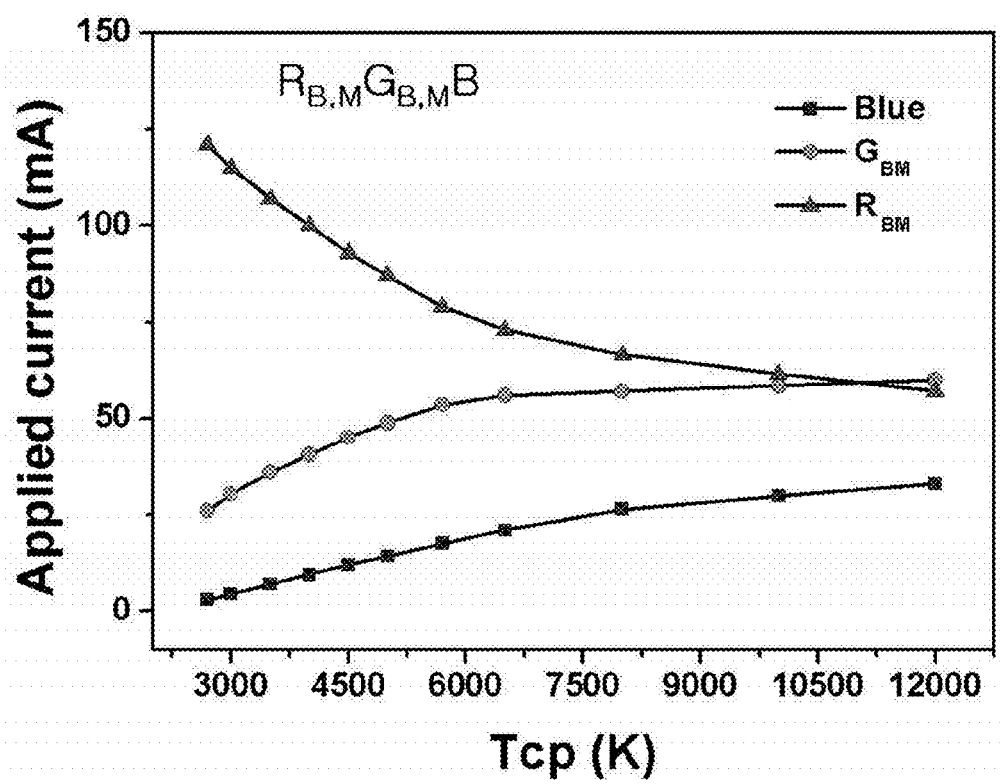
Figure 25:
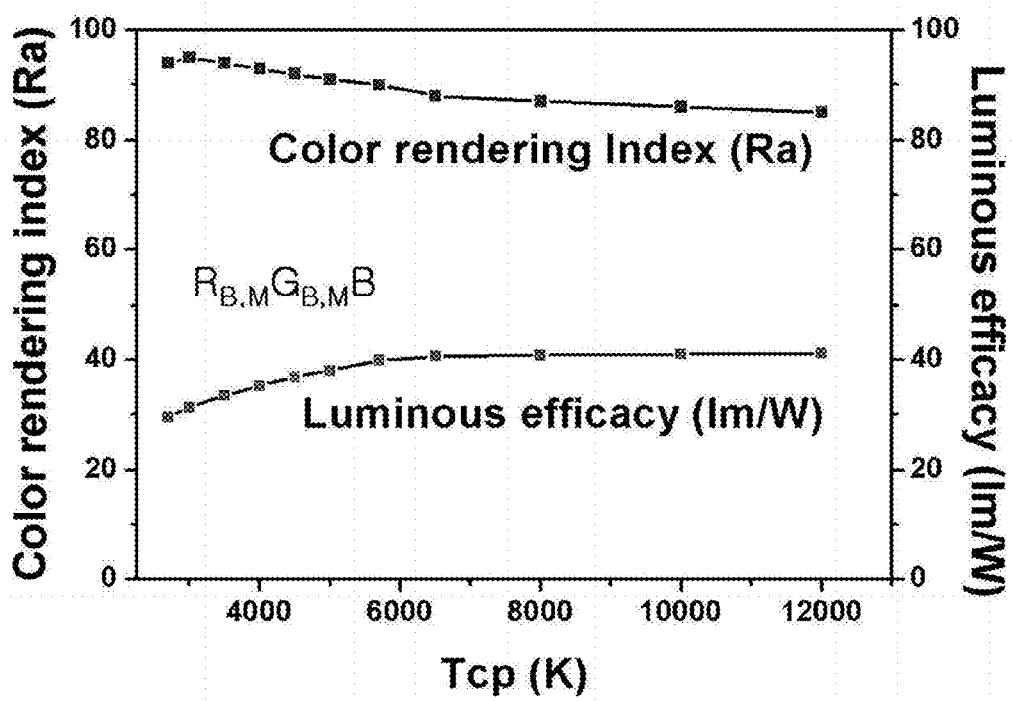

FIG. 24 shows changes in driving current as a function of correlated color temperature (Tcp), and FIG. 25 shows changes in color rendering index ($R_a$) and luminous efficacy as a function of correlated color temperature (Tcp). Various correlated color temperatures can be realized in response to changes in the amount of current applied to the $R_{B,M}G_{B,M}B$ packages. The full widths at half maximum (FWHM) of the emission spectra of the RGB single-color packages are large, indicating high color rendering index of the white LED device manufactured by combining the single packages. The efficiency of the green pc-LED is improved, resulting in higher efficiency of the white LED device than that of the conventional white LED device composed of an RGB multi-chip. Particularly, the color rendering index of the conventional white LED composed of an RGB multi-chip is at most 70, whereas the multi-package white LED device which includes three single-color LED packages, from which light beams are irradiated and mixed to achieve white light emission, at least one package of the single-color LED packages being a phosphor-converted LED, has a color rendering index ($R_a$) of at least 80, preferably at least 85, in the correlated color temperature range of 2,700-12,000 K. This color rendering index could not be achieved by a conventional RGB multi-chip including three single-color chips.

Example 2

Manufacture of $RG_{B,M}B$ Multi-Package

An $RG_{B,M}B$ multi-package was manufactured by combining the R, $G_{B,M}$ and B LEDs of Fabrication Example 1.

Experimental Example 2

Evaluation of Optical Properties of the $RG_{B,M}B$ Multi-Package

Figure 26:
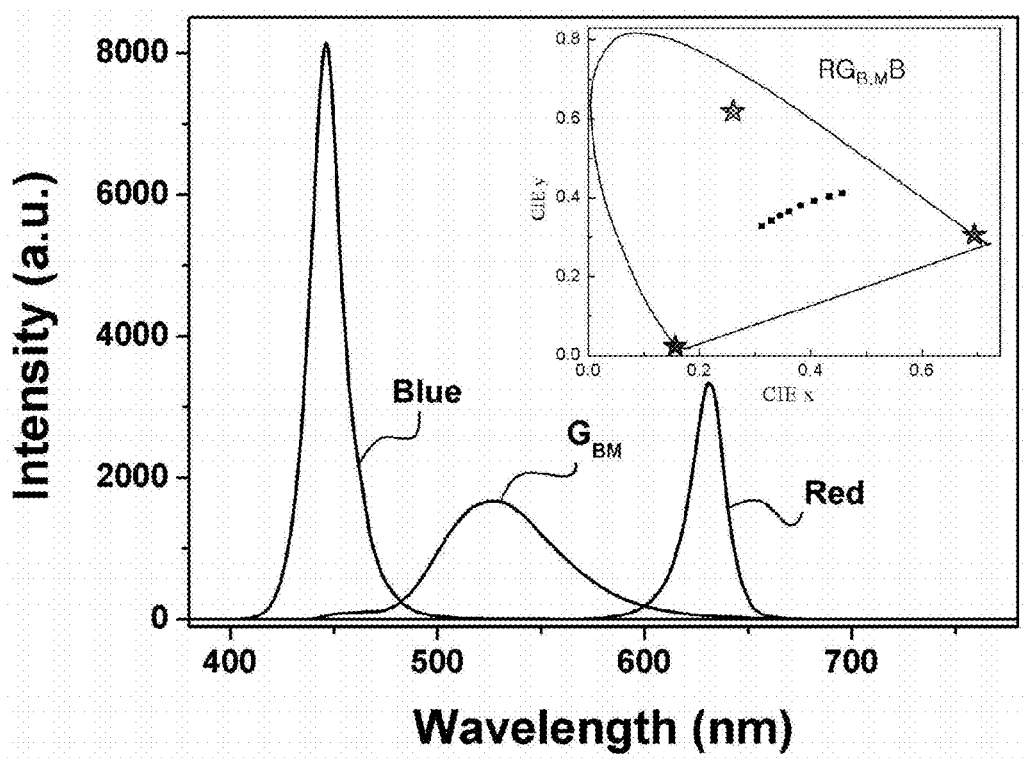
FIGS. 26 to 29 graphically show the physical properties of a white LED device composed of an $RG_{B,M}B$ multi-package according to the present invention: specifically.
Figure 27:
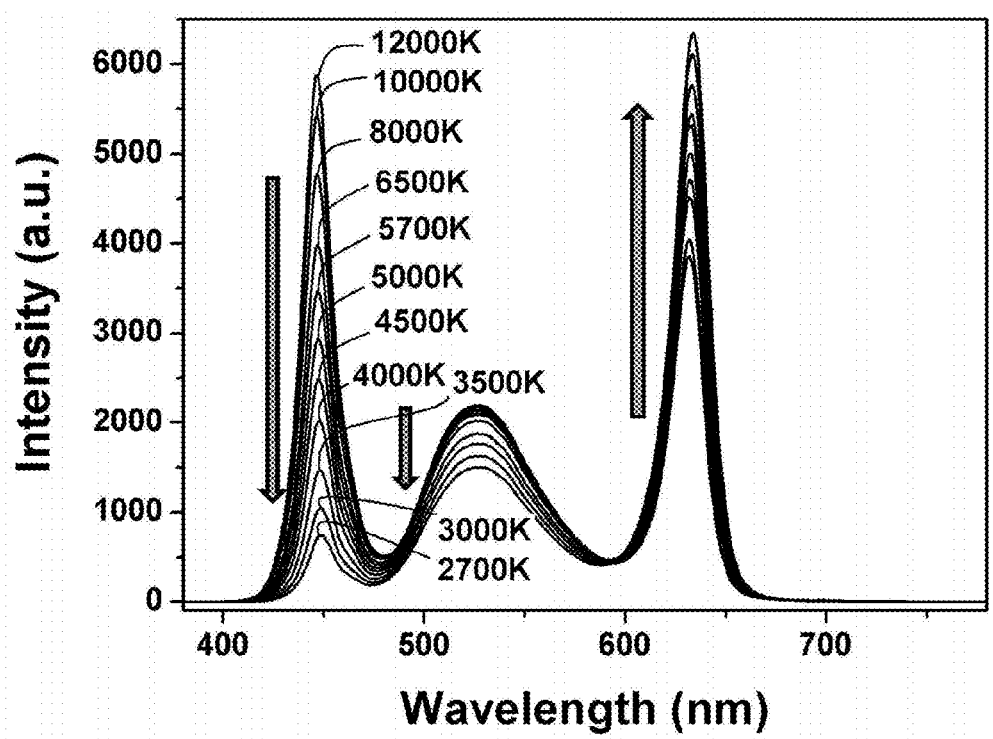

The optical properties of the $RG_{B,M}B$ multi-package manufactured in Example 2 were evaluated. FIGS. 26 to 29 graphically show the physical properties of the white LED device composed of the $RG_{B,M}B$ multi-package. $G_{B,M}$ is the G1 pc-LED. Specifically, FIG. 26 shows changes in light intensity as a function of wavelength. The inset in FIG. 26 shows the color coordinates of the single-color LEDs. FIG. 27 graphically shows changes in light intensity at different correlated color temperatures as a function of wavelength. The graph shows that the white LED device composed of the $RG_{B,M}B$ multi-package can emit white light with various correlated color temperatures, like the conventional white LED device composed of an RGB multi-chip.

Figure 28:
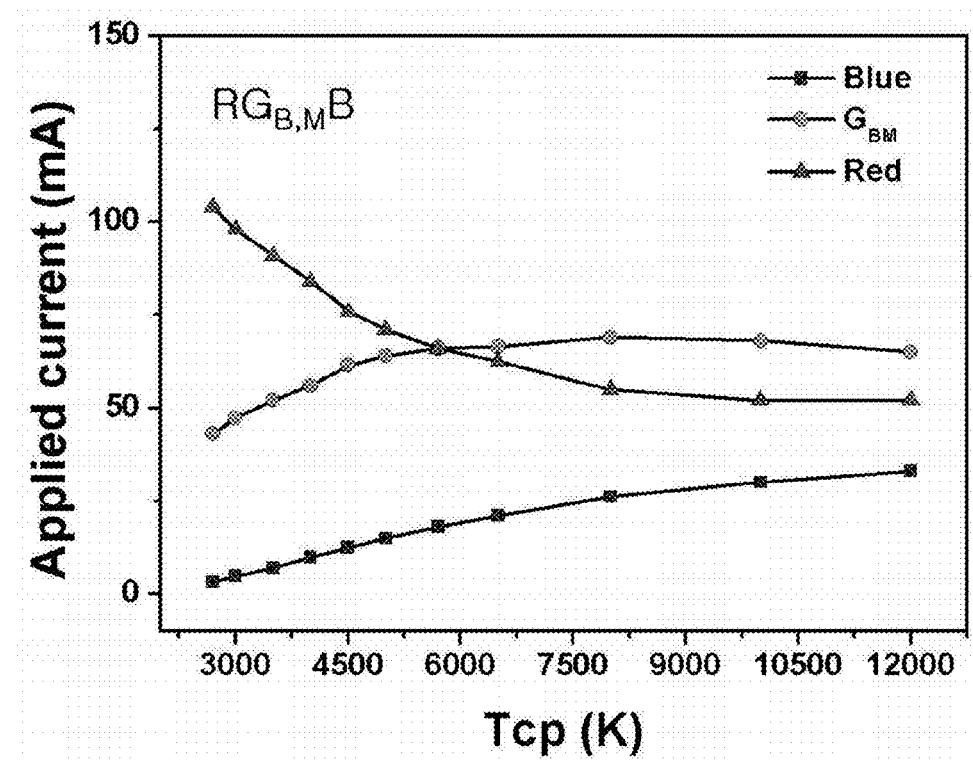
Figure 29:
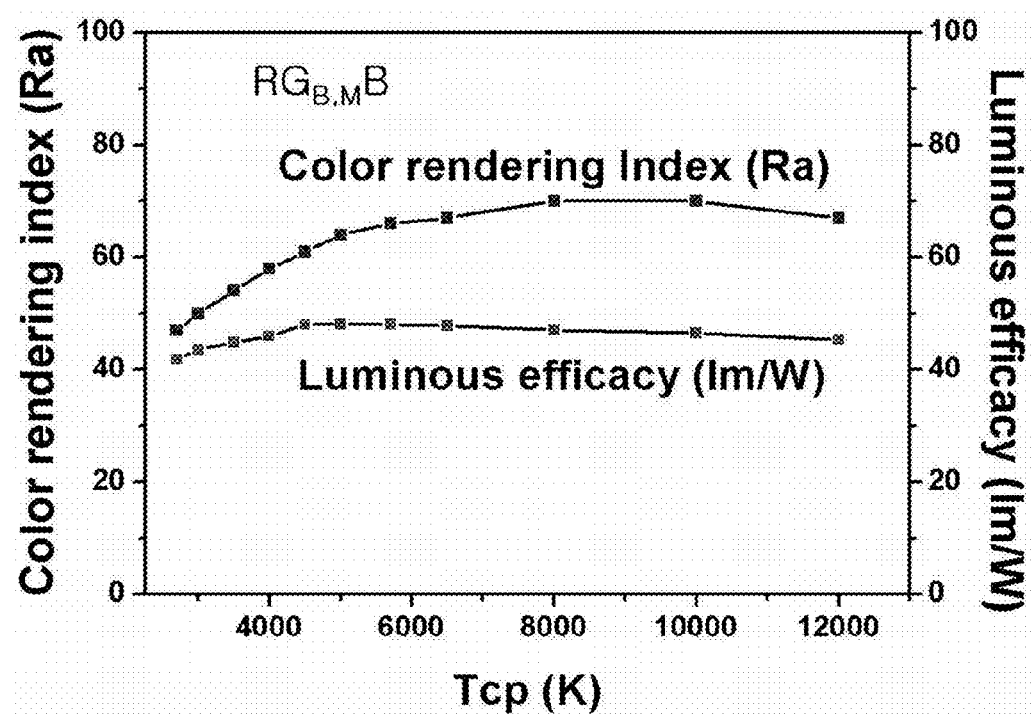
Figure 30:
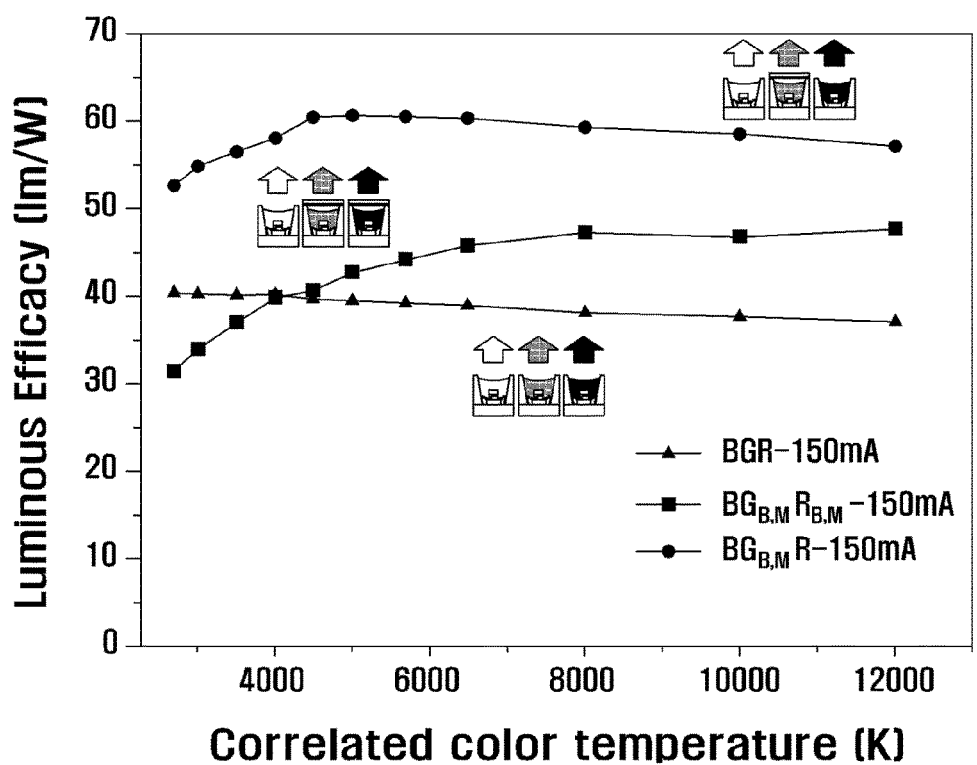
FIGS. 30 to 33 are graphs evaluating the physical properties of BGR multi-chips, $R_{B,M}G_{B,M}B$ and $RG_{B,M}B$ multi-packages for white light emission at 150 mA: specifically, FIGS. 30 to 33 graphically show changes in the luminous efficacy, relative efficiency relative brightness and color rendering index of the multi-packages as a function of correlated color temperature (Tcp), respectively.
Figure 31:
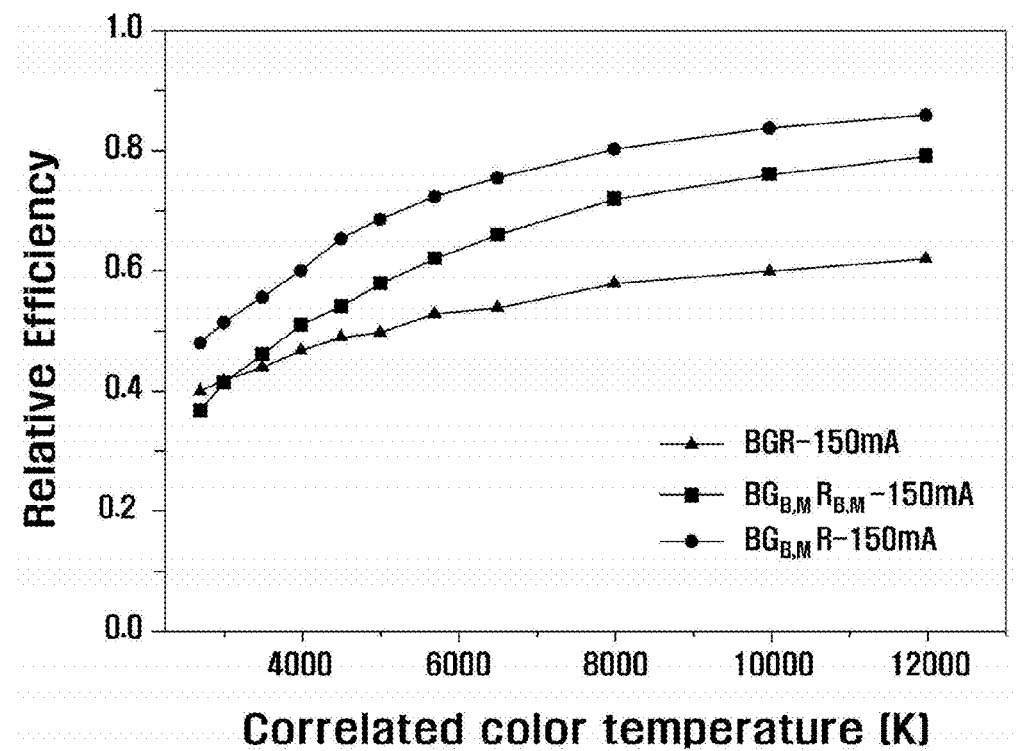
Figure 32:
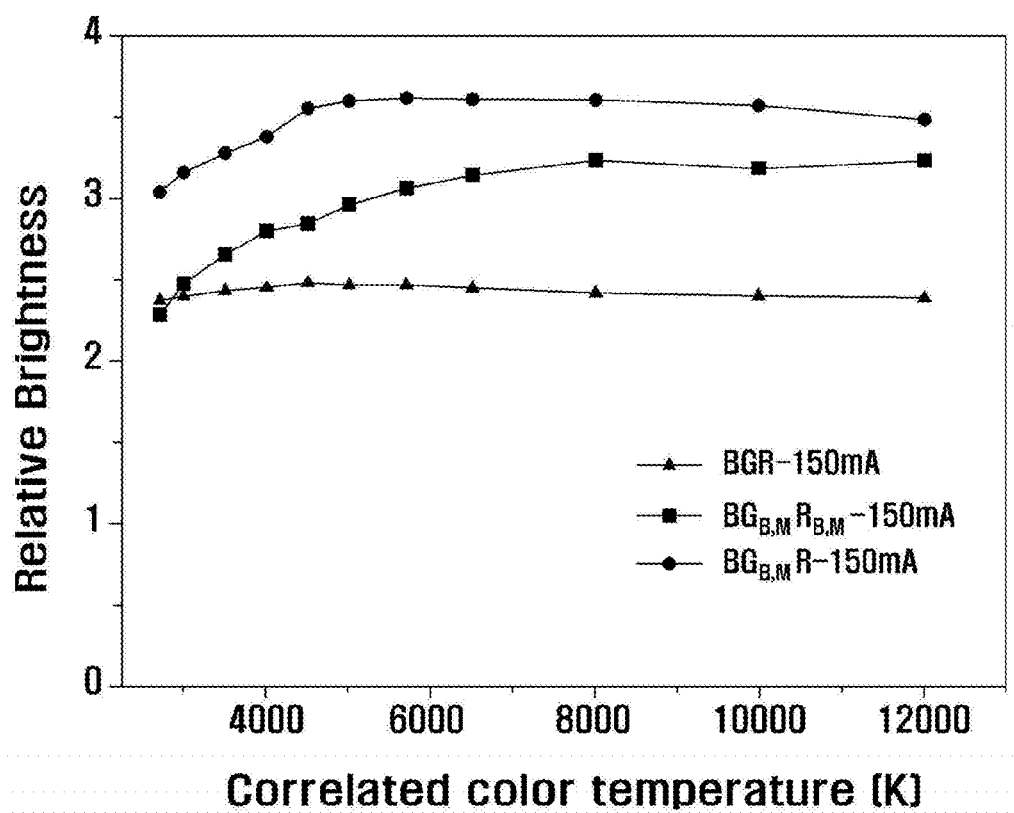
Figure 33:
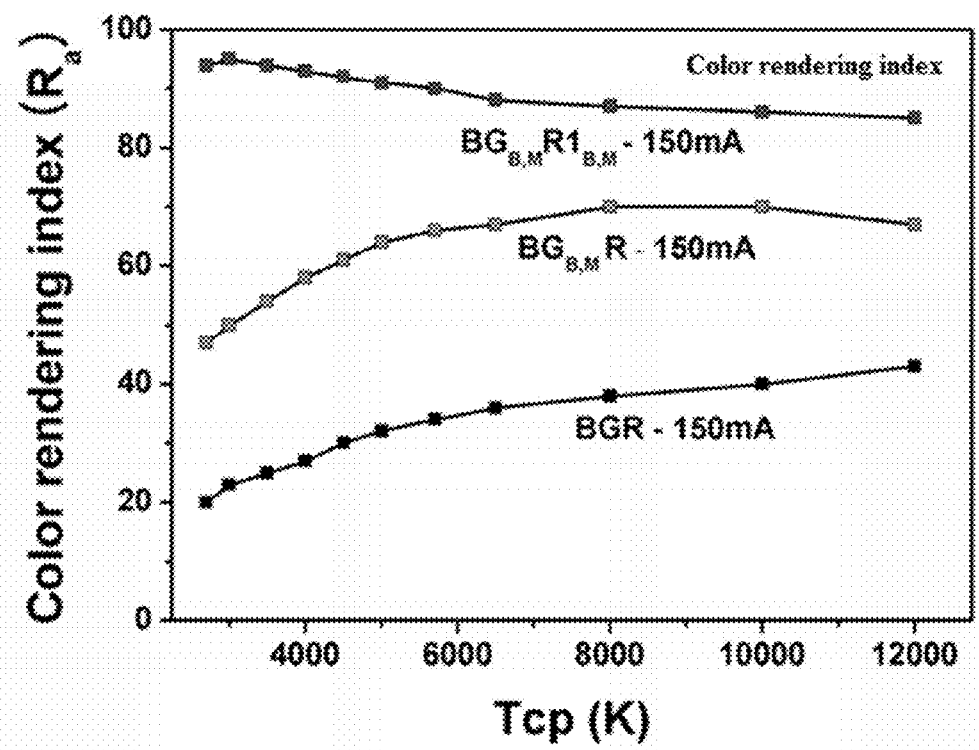

FIG. 28 shows changes in the driving current of the single chips or packages as a function of correlated color temperature (Tcp), and FIG. 29 shows changes in color rendering index ($R_a$) and luminous efficacy as a function of correlated color temperature (Tcp). Various correlated color temperatures can be realized in response to changes in the amount of current applied to the $RG_{B,M}B$ packages. The full width at half maximum (FWHM) of the emission spectrum of the $G_{B,M}$ green package is large, indicating high color rendering index of the white LED device manufactured by combining the single chips and packages. The efficiency of the green pc-LED is improved, resulting in higher efficiency of the white LED device than that of the conventional white LED device composed of an RGB multi-chip. These results lead to the conclusion that the white LED device of the present invention in which all or some of the single-color packages, such as green and red packages, other than a blue chip are phosphor-converted single-color LEDs including long-wavelength pass filters show markedly improved physical properties compared to the conventional white LED device using single-color LEDs only.

Experimental Example 3

Evaluation of Optical Properties of the BGR, $R_{B,M}G_{B,M}B$, and $RG_{B,M}B$ Multi-Packages The optical properties of the BGR, $R_{B,M}G_{B,M}B$ and $RG_{B,M}B$ multi-packages and manufactured in Examples 1-2 and Comparative Example 1 were evaluated. FIGS. 30 to 33 are graphs evaluating the physical properties of the BGR, $R_{B,M}G_{B,M}B$ and $RG_{B,M}B$ multi-packages for white light emission at 150 mA. Specifically, FIGS. 30 to 33 graphically show changes in the luminous efficacy, relative efficiency relative brightness and color rendering index of the multi-packages as a function of correlated color temperature (Tcp), respectively. From the graphs, it can be seen that the physical properties of the multi-package including at least one phosphor-converted single package including the long-wavelength pass filter are much better than those of the conventional multi-chip including RGB single-color LEDs.

Example 3

Manufacture of $W_B R_{B,M} G_{B,M} B$ Multi-Package

A $W_B R_{B,M} G_{B,M} B$ multi-package was manufactured by combining the $W_B$, $R_{B,M}$, $G_{B,M}$ and B LEDs of Fabrication Example 1.

Experimental Example 4

Evaluation of Optical Properties of the $W_B R_{B,M} G_{B,M} B$ Multi-Package

Figure 34:
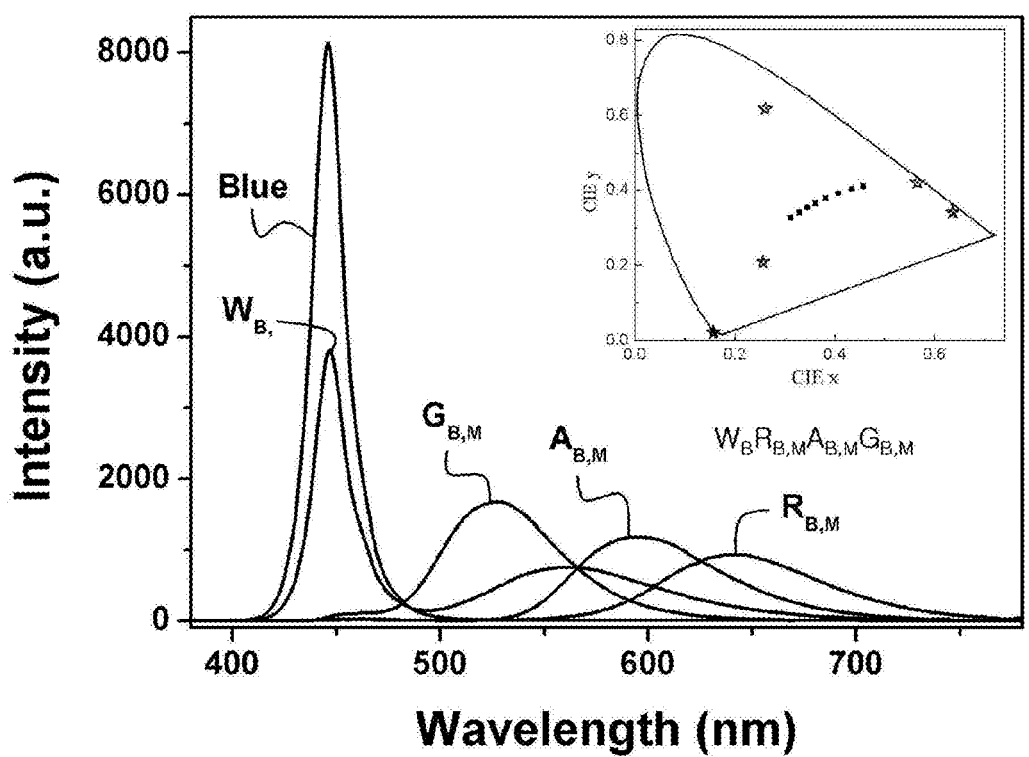
FIGS. 34 to 37 graphically show the physical properties of a white LED device composed of a $W_BR_{B,M}A_{B,M}G_{B,M}$ multi-package according to one preferred embodiment of the present invention: specifically.
Figure 35:
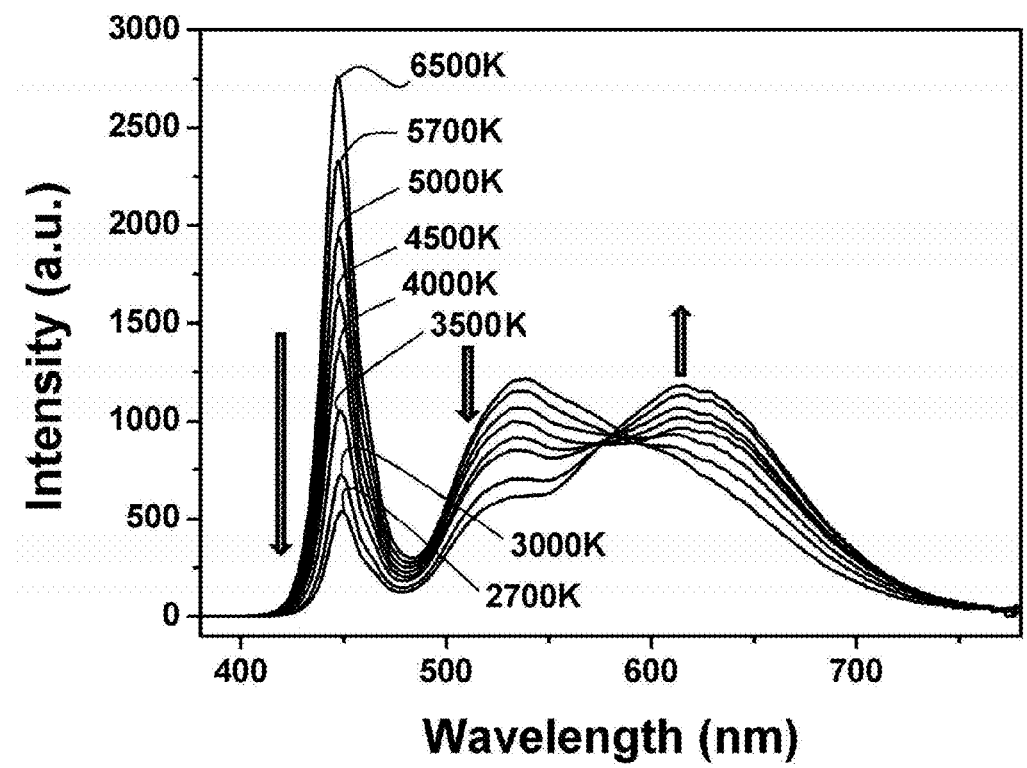

The optical properties of the $W_B R_{B,M} G_{B,M} B$ multi-package manufactured in Example 3 were evaluated. FIGS. 34 to 37 graphically show the physical properties of the white LED device composed of the $W_B R_{B,M} A_{B,M} G_{B,M}$ multi-package according to one preferred embodiment of the present invention. $R_{B,M}$ and $G_{B,M}$ are R2 and G1 pc-LED single packages, respectively, and $W_B$ is a white pc-LED package using Y1. Specifically, FIG. 34 shows changes in light intensity as a function of wavelength. The inset in FIG. 34 shows the color coordinates of the single-color LEDs. FIG. 35 shows changes in light intensity at different correlated color temperatures as a function of wavelength. The graph shows that the white LED device manufactured using the $W_B R_{B,M} G_{B,M} B$ multi-package can emit white light with various correlated color temperatures compared to the conventional white LED including an RGB multi-chip.

Figure 36:
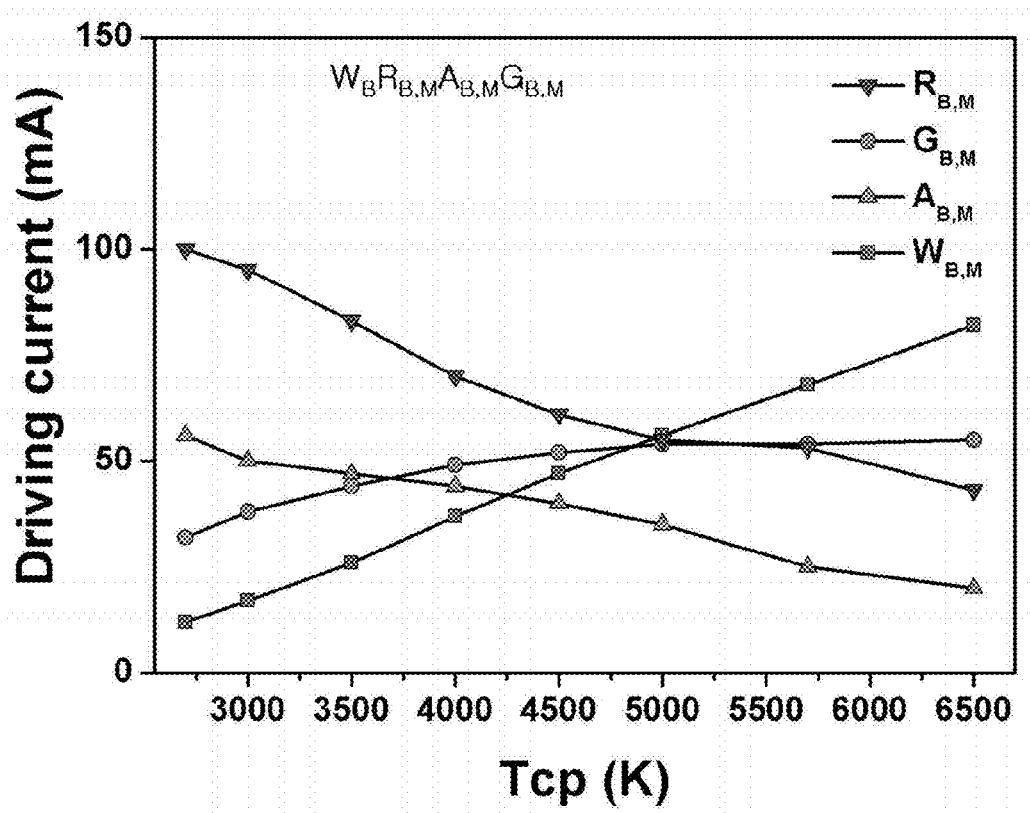
Figure 37:
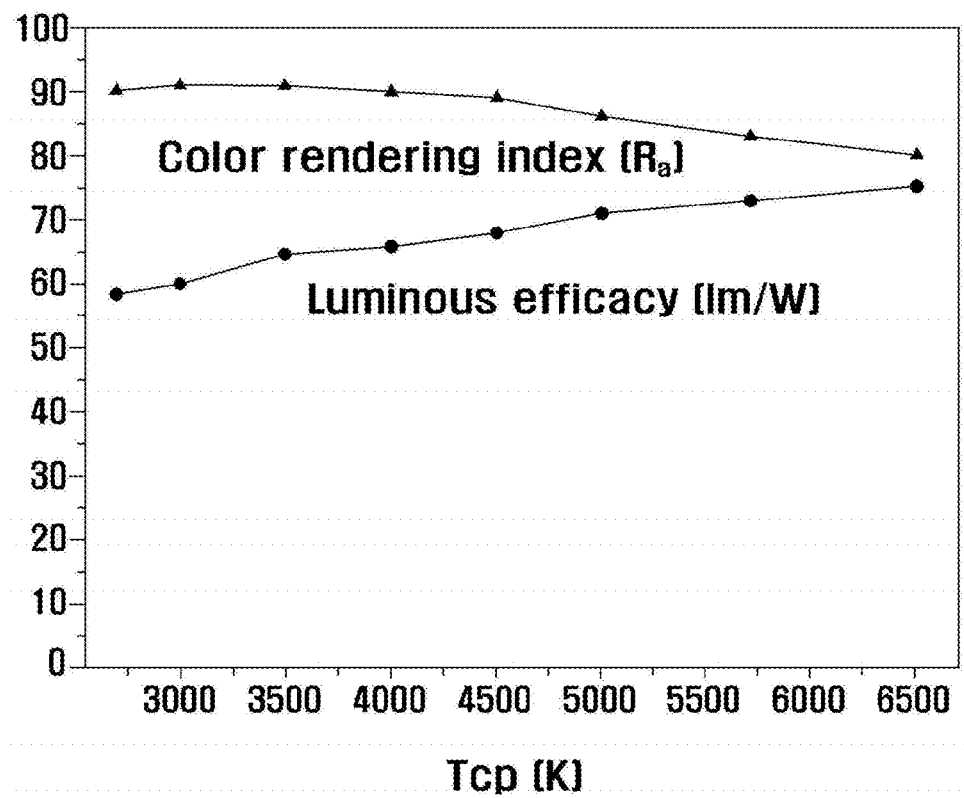
Figure 38:
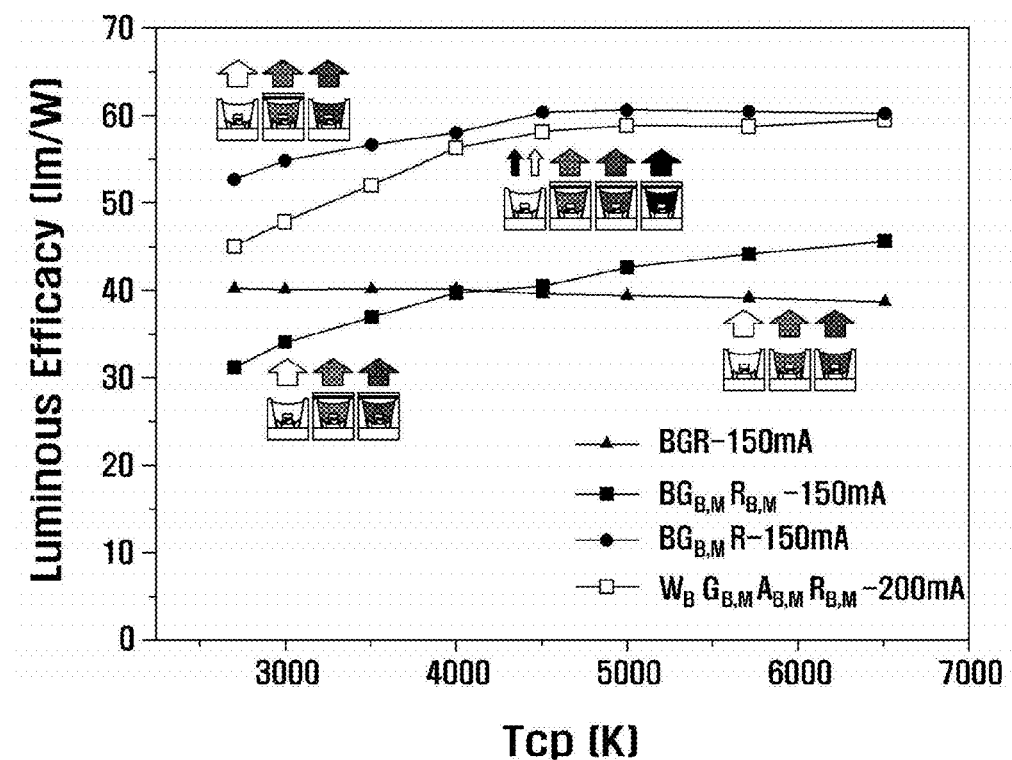
FIGS. 38 to 41 are graphs evaluating the physical properties of BGR multi-chips, $R_{B,M}G_{B,M}B$, $RG_{B,M}B$ and $W_BR_{B,M}A_{B,M}G_{B,M}$ multi-packages for white light emission at 150 mA and 200 mA: specifically, FIGS. 38 to 41 graphically show changes in the luminous efficacy, relative efficiency, relative brightness and color rendering index of the multi-packages as function of correlated color temperature (Tcp), respectively.
Figure 39:
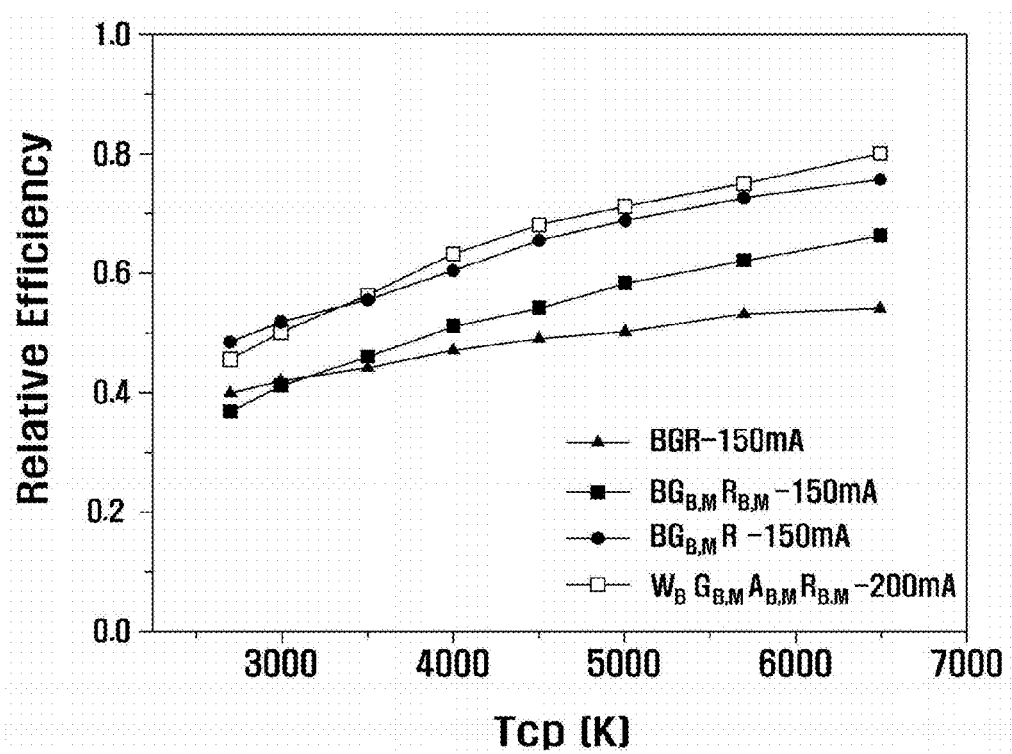
Figure 40:
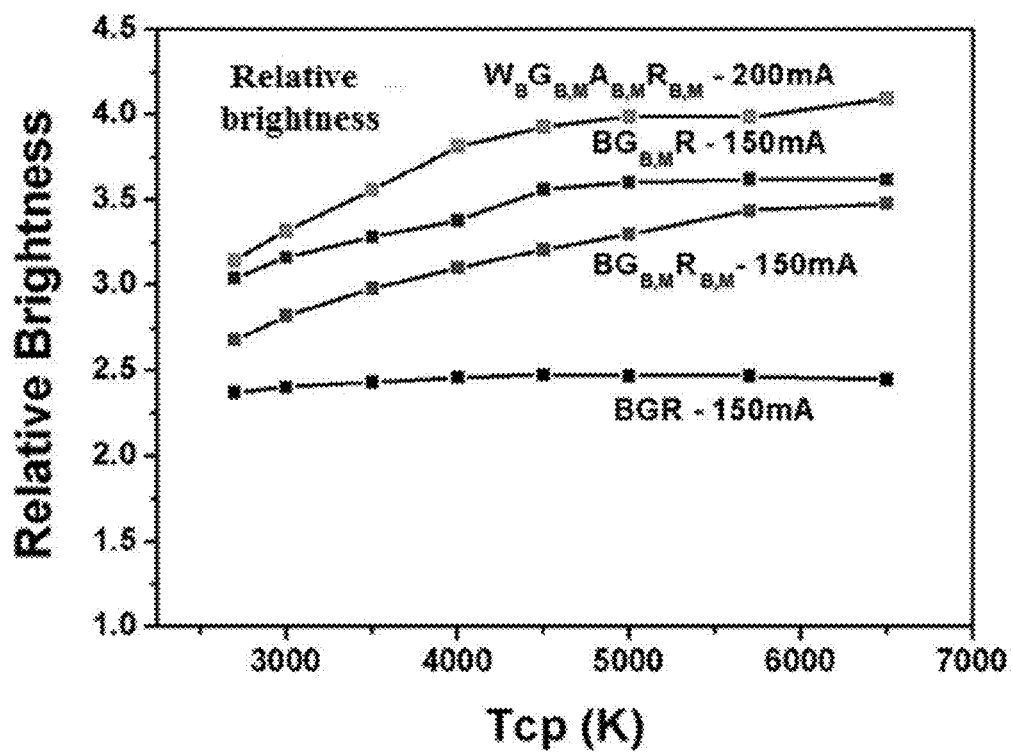
Figure 41:
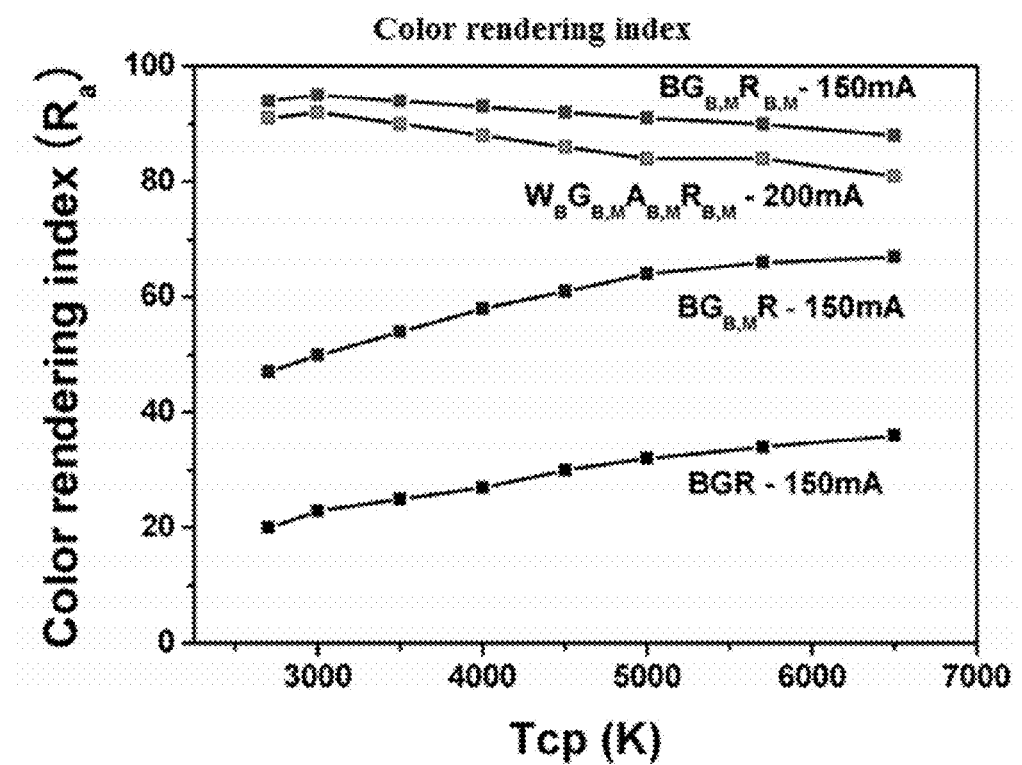

FIG. 36 shows changes in the driving current of the single chips and packages as a function of correlated color temperature (Tcp), and FIG. 37 shows changes in color rendering index ($R_a$) as a function of correlated color temperature (Tcp). Various correlated color temperatures can be realized in response to changes in the amount of current applied to the $W_B R_{B,M} A_{B,M} G_{B,M}$ packages. The full widths at half maximum (FWHM) of the emission spectra of the yellow, red, amber and green packages of the $W_B R_{B,M} A_{B,M} G_{B,M}$ multi-package are large, indicating very high color rendering index of the white LED device manufactured by combining the single packages. The efficiency of the phosphor-converted single-color LEDs is improved, resulting in higher efficiency of the white LED device than that of the conventional white LED device composed of an RGB multi-chip.

Example 4

Manufacture of BGR, $BG_{B,M}R_{B,M}$, $BG_{B,M}R$ and $W_B R_{B,M} A_{B,M} G_{B,M}$ Multi-Packages BGR, $BG_{B,M}R_{B,M}$, $BG_{B,M}R$ and $W_B R_{B,M} A_{B,M} G_{B,M}$ multi-packages were manufactured using the LEDs of Fabrication Example 1.

Experimental Example 5

Evaluation of Optical Properties of the BGR, $BG_{B,M}R_{B,M}$, $BG_{B,M}R$ and $W_B R_{B,M} A_{B,M} G_{B,M}$ Multi-Packages The optical properties of the BGR, $BG_{B,M}R_{B,M}$, $BG_{B,M}R$ and $W_B R_{B,M} A_{B,M} G_{B,M}$ multi-packages manufactured in Example 4 were evaluated. FIGS. 38 to 41 are graphs evaluating the physical properties of the BGR, $BG_{B,M}R_{B,M}$, $BG_{B,M}R$ and $W_B R_{B,M} A_{B,M} G_{B,M}$ multi-packages for white light emission at 150 mA and 200 mA. Specifically, FIGS. 38 to 41 graphically show changes in the luminous efficacy, relative efficiency, relative brightness and color rendering index of the multi-packages as function of correlated color temperature (Tcp), respectively. From the graphs, it can be seen that the physical properties of the multi-packages composed at least one phosphor-converted single package including the long-wavelength pass filter are much better than those of the conventional multi-chip composed of RGB single-color LEDs.

Example 5

Fabrication of $G_{B,M}$ Single-Color LED and Manufacture of $R_{B,M}G_{B,M}B$ and $R_{B,M}A_{B,M}G_{B,M}B$ Multi-Packages Depending on the External Quantum Efficiency of B Blue Chips Single-color and white LEDs were fabricated using the blue chip of Fabrication Example 1 (external quantum efficiency=0.34, 13 mW, Dongbu LED) and blue chips with improved efficiencies (external quantum efficiencies=0.40 and 0.49, 18 mW and 22 mW, Dongbu LED) by the same method described in Fabrication Example 1. The blue LEDs having external quantum efficiencies of 0.40 and 0.49 were defined as B2 and B3, respectively, to distinguish from the blue LED of Fabrication Example 1. $G_{B2,M}$ and $G_{B3,M}$ green LEDs were fabricated by the method described in Fabrication Example 1, and their efficiency characteristics were compared. $A_{B3,M}$ amber and $R_{B3,M}$ red LEDs were fabricated and used to manufacture $R_{B3,M}G_{B3,M}B3$ and $R_{B3,M}A_{B3,M}G_{B,M}B3$ multi-packages. The characteristics of the multi-packages were compared with those of the white LED device including an RGB multi-chip.

Experimental Example 6

Figure 42:
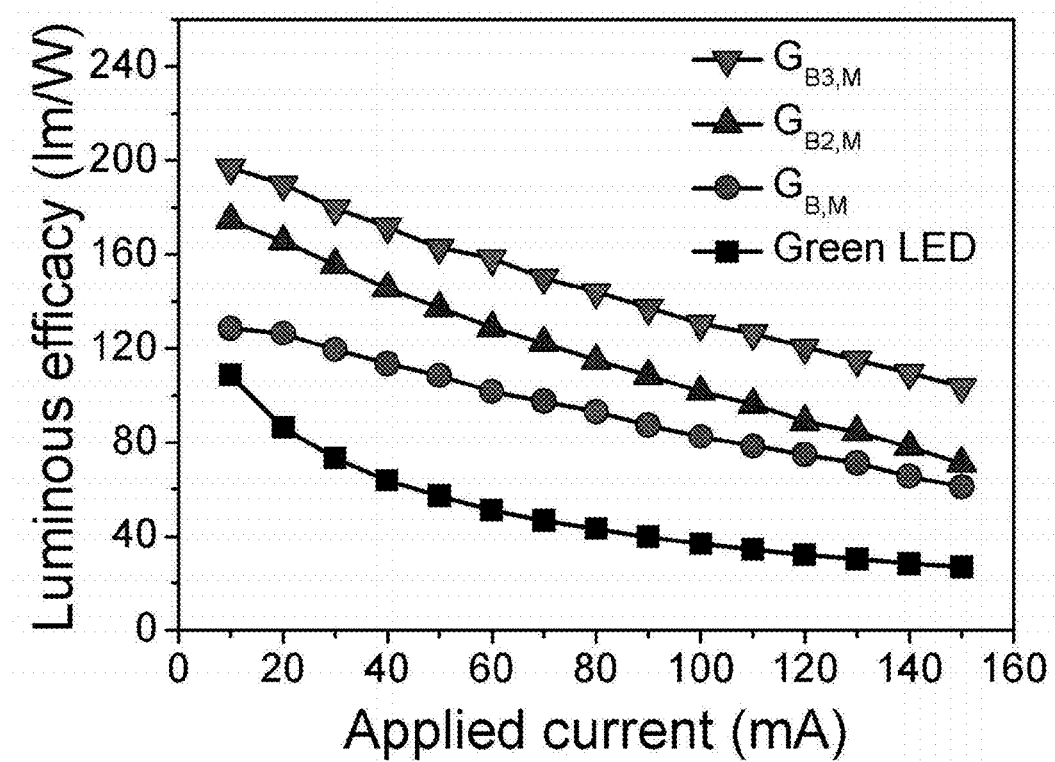
FIG. 42 graphically shows changes in the luminous efficacy of $G_{B,M}$, $G_{B2,M}$, $G_{B3,M}$ and G as green packages or chips with increasing external quantum efficiency of blue LEDs (B=0.34, B2=0.40, B3=0.49) as a function of driving current from 10 mA to 150 mA.

Evaluation of Optical Properties of the $G_{B,M}$, $G_{B2,M}$, $G_{B3,M}$ Packages and G Green Chip The optical properties of the $G_{B,M}$, $G_{B2,M}$, $G_{B3,M}$ packages and G green chip fabricated in Fabrication Example 1 and Example 5 were evaluated. FIG. 42 graphically shows changes in the luminous efficacy of the green packages/chip of $G_{B,M}$, $G_{B2,M}$, $G_{B3,M}$ and G as a function of driving current from 10 mA to 150 mA. Specifically, an improvement in the external quantum efficiency of the blue LEDs as excitation sources led to marked improvement in the efficiency of the phosphor-converted single-color LEDs. The single-color LEDs based on the LEDs with improved external quantum efficiencies showed markedly improved efficiencies compared to those based on the blue LEDs used in Examples 1-4.

Experimental Example 7

Figure 43:
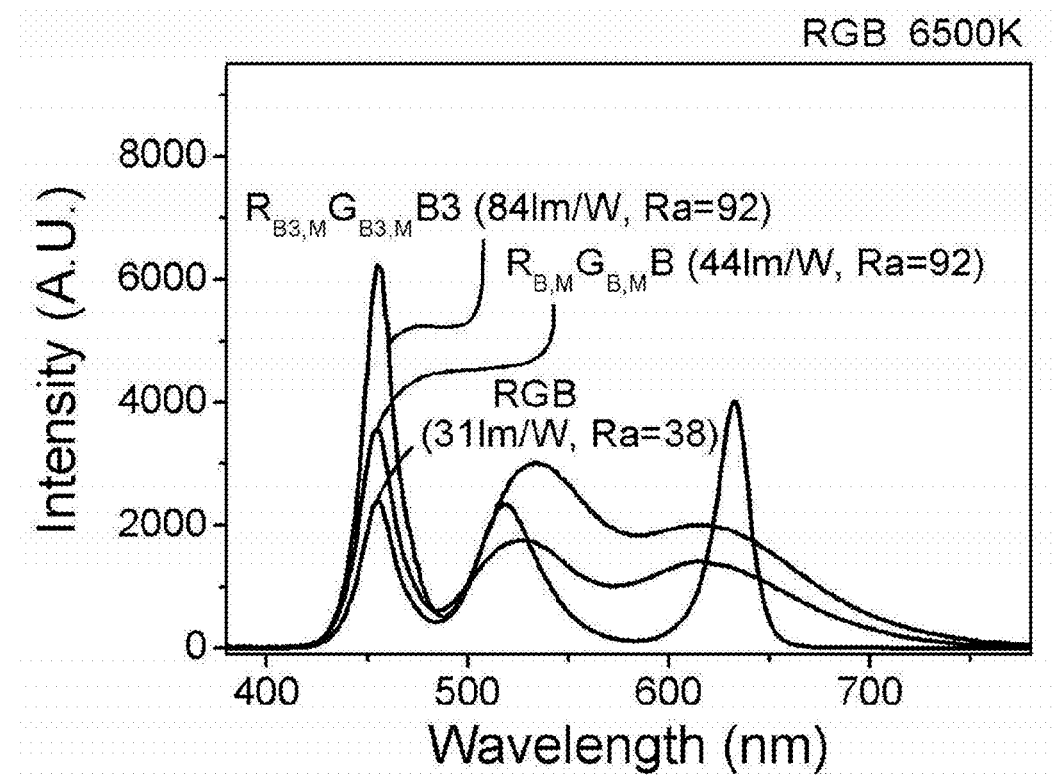
FIGS. 43 and 44 graphically show changes in the emission spectrum, luminous efficacy and color rendering index ($R_a$) of white light from RGB, $R_{B,M}G_{B,M}B$ and $R_{B3,M}G_{B3,M}B3$ at correlated color temperatures (Tcp) of 6,500 K and 3,500 K, respectively.
Figure 44:
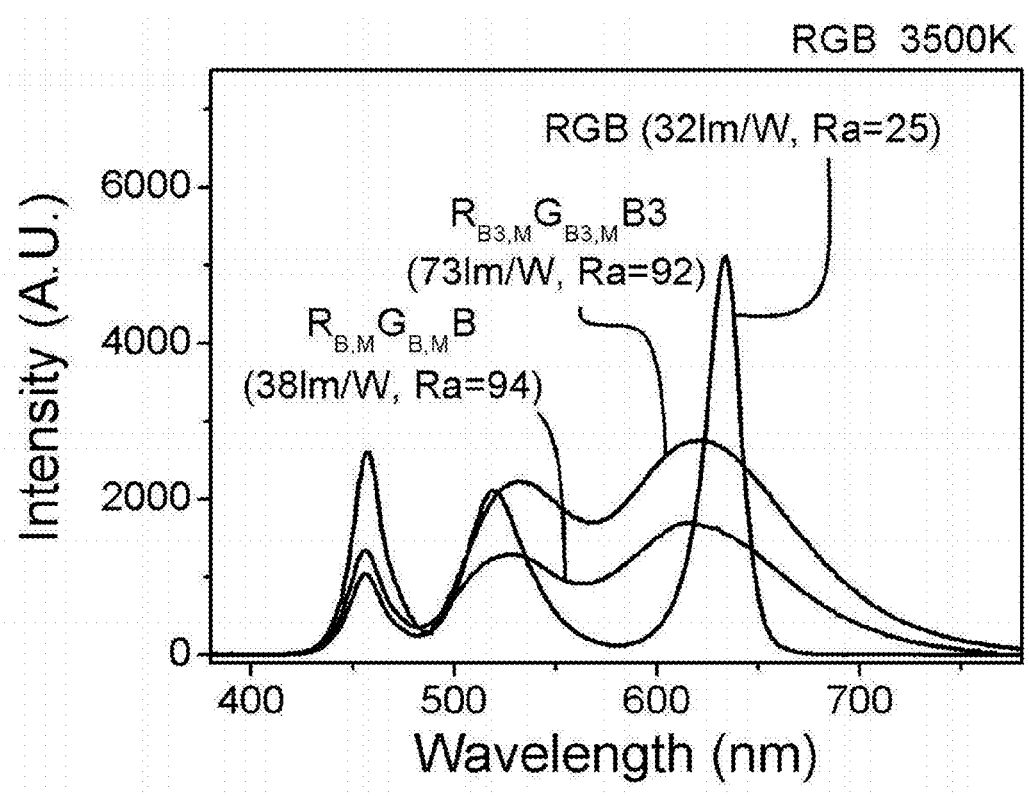
Figure 45:
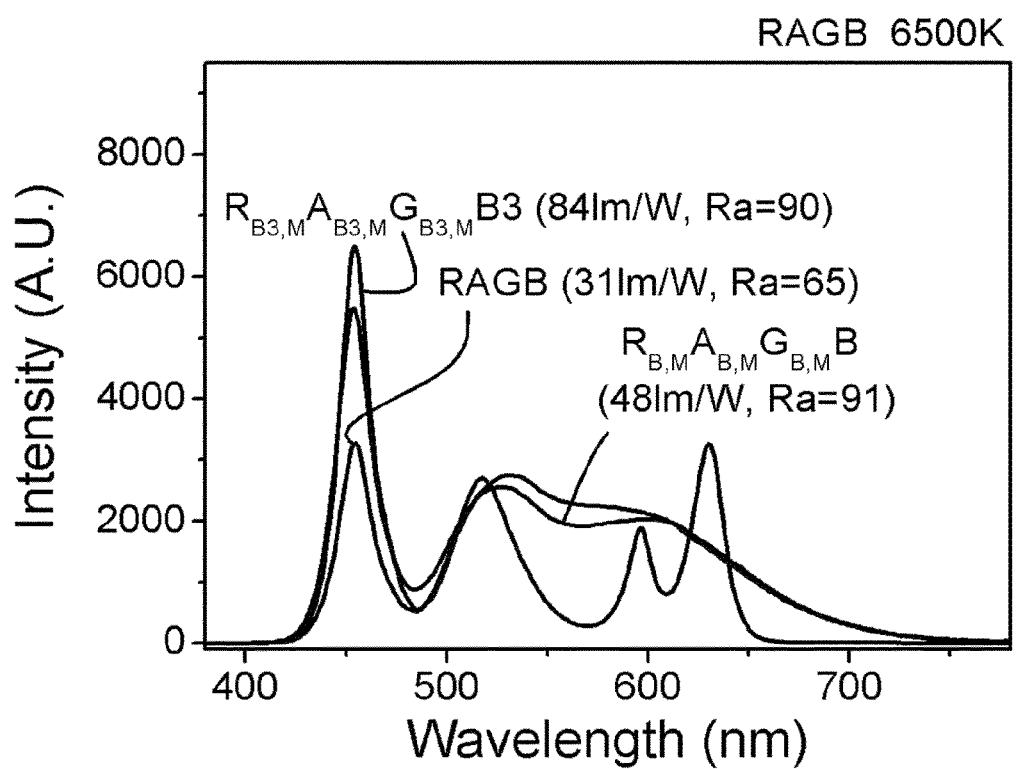
FIGS. 45 and 46 graphically show changes in the emission spectrum, luminous efficacy and color rendering index ($R_a$) of white light from RGB, $R_{B,M}A_{B,M}G_{B,M}B$ and $r_{B3,M}A_{B3,M}G_{B3,M}B3$ at correlated color temperatures (Tcp) of 6,500 K and 3,500 K, respectively.
Figure 46:
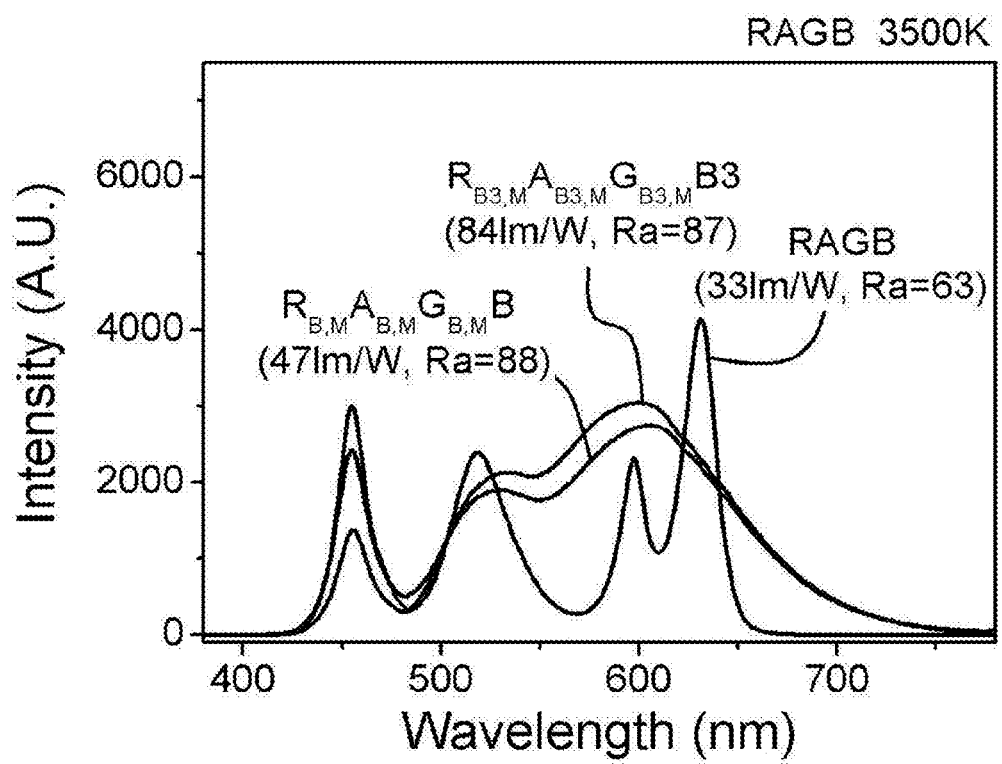
Figure 47:
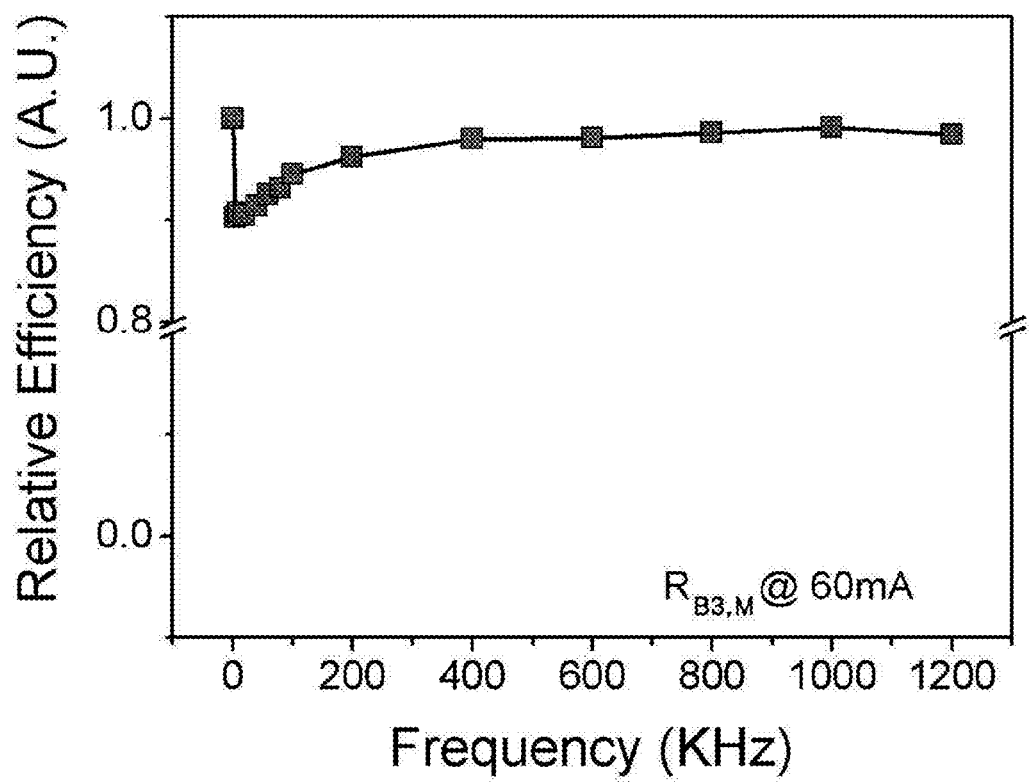
FIGS. 47 to 50 graphically show changes in the efficiency of $R_{B3,M}$, $A_{B3,M}$ and $G_{B3,M}$ as single packages and B3 as a blue chip at an external current of 60 mA with increasing frequency of pulse waves from 5 Hz to 1,200 kHz relative to continuous waves (frequency=0), respectively.
Figure 48:
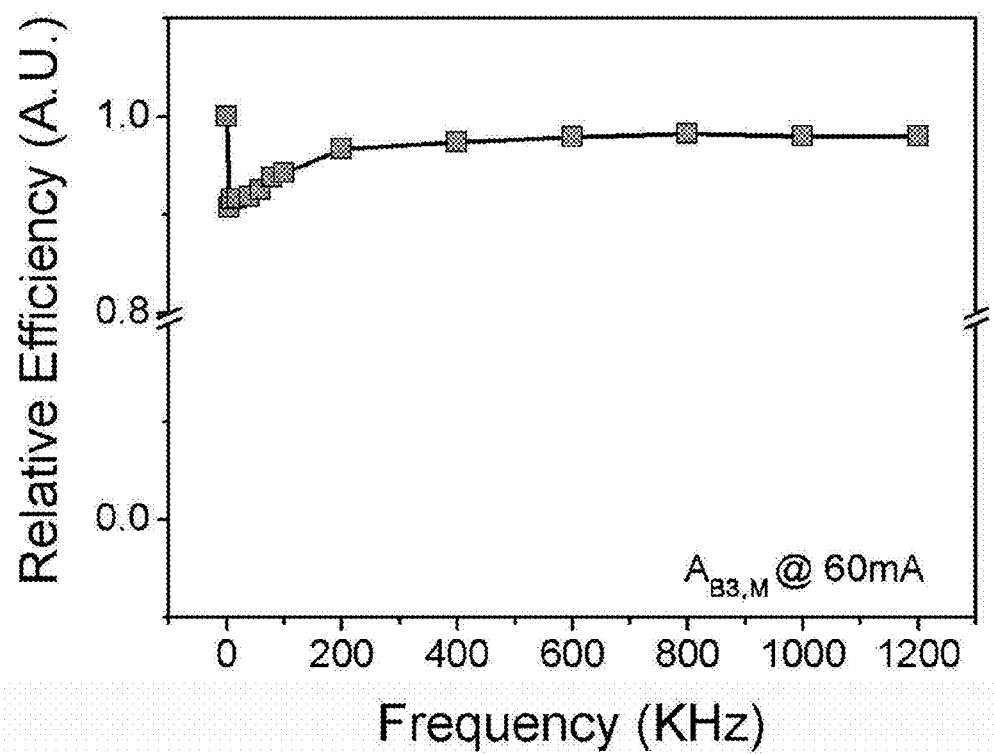
Figure 49:
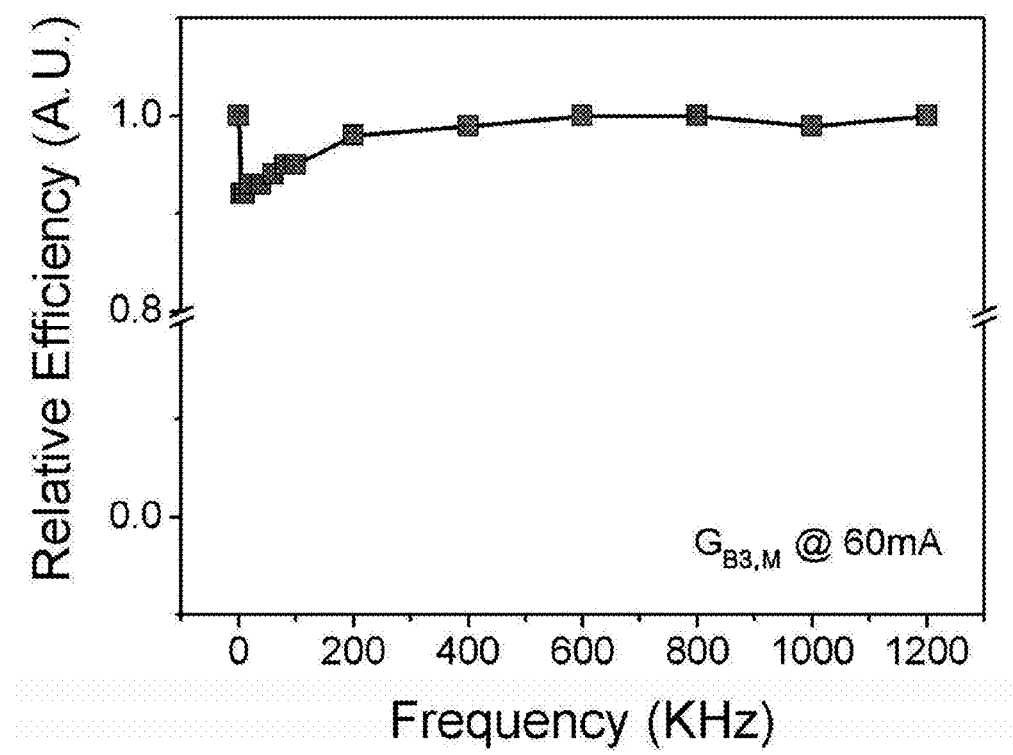
Figure 50:
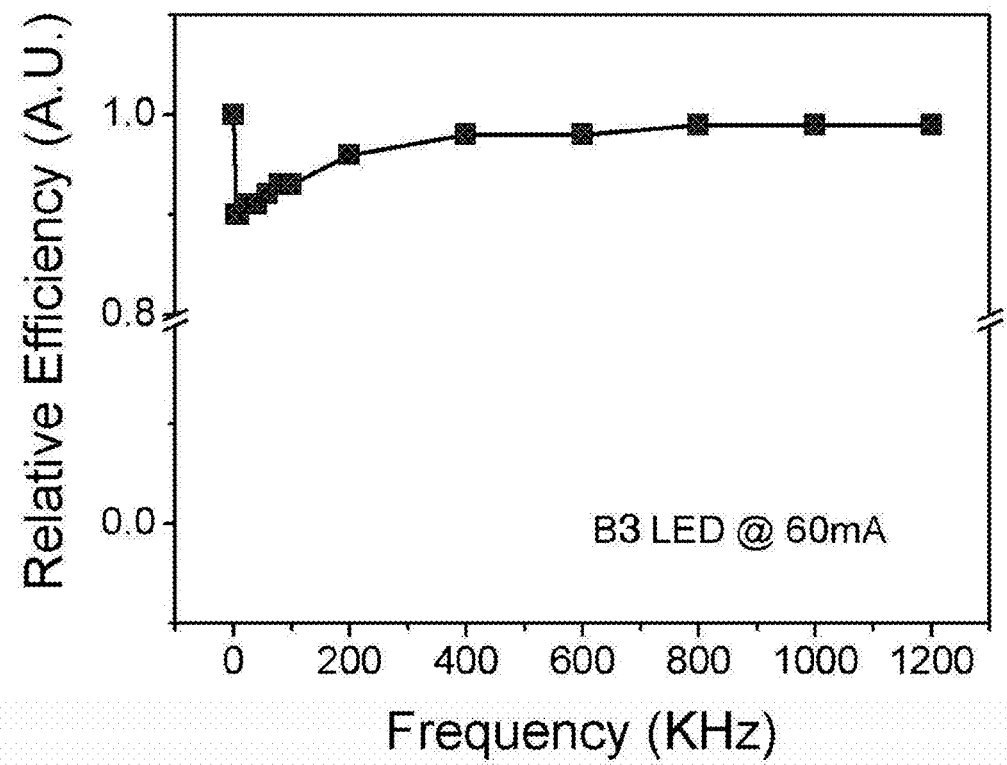

Evaluation of Optical Properties of RGB Multi-Chip, $R_{B,M}G_{B,M}B$, $R_{B3,M}G_{B3,M}B3$, $R_{B,M}A_{B,M}G_{B,M}B$ and $R_{B3,M}A_{B3,M}G_{B3,M}B3$ Multi-Packages FIGS. 43 and 44 graphically show changes in the emission spectrum, luminous efficacy and color rendering index ($R_a$) of white light from RGB, $R_{B,M}G_{B,M}B$ and $R_{B3,M}G_{B3,M}B3$ at correlated color temperatures (Tcp) of 6,500 K and 3,500 K, respectively. FIGS. 45 and 46 graphically show changes in the emission spectrum, luminous efficacy and color rendering index ($R_a$) of white light from RGB, $R_{B,M}A_{B,M}G_{B,M}B$ and $R_{B3,M}A_{B3,M}G_{B3,M}B3$ at correlated color temperatures (Tcp) of 6,500 K and 3,500 K, respectively.

As the efficiency of the blue LED as an excitation source in the phosphor-converted single-color package including the long-wavelength pass filter increased, the efficiency of the phosphor-converted single-color LED was markedly improved. As shown in FIGS. 43 to 46, the efficiency of the multi-package white LED device including at least one phosphor-converted single package including the long-wavelength pass filter was markedly improved as the efficiency of the blue LED was improved. The improved characteristics of the blue LED can bring about a marked improvement in the efficiency of the multi-package white LED device including at least one phosphor-converted single package. In addition, considerable improvements in the color rendering index and luminous efficacy of the multi-package white LED device including at least one phosphor-converted single package were achieved compared to the conventional multi-chip white LED device using RGB LEDs.

Example 6

Fabrication of $R_{B3,M}$, $G_{B3,M}$ and $A_{B3,M}$ as Phosphor-Converted Red, Amber and Green LEDs Using Blue Chips B3

Single-color LEDs were fabricated using blue chips (B3=0.49) with improved efficiency by the method described in Fabrication Example 1.

Experimental Example 8

Evaluation of Optical Properties of the Single-Color Packages $R_{B3,M}$, $A_{B3,M}$ and $G_{B3,M}$ Fabricated in Example 6 and the Blue Chip B3 Depending on the Frequency of Pulse Waves FIGS. 47 to 50 graphically show changes in the efficiency of the single packages $R_{B3,M}$, $A_{B3,M}$ and $G_{B3,M}$ and the blue chip B3 at an external current of 60 mA with increasing frequency of pulse waves from 5 Hz to 1,200 kHz relative to continuous waves (frequency=0), respectively. The graphs show that the efficiencies of all single-color packages at around 500 kHZ, which is a frequency for temporal mixing, were 90% or more of the efficiency obtained when driven with continuous waves (CW).

Examples 1-5 show examples of white light emission achieved by mixing three color packages, i.e. blue, green and red chips, or four color packages, i.e. blue, green, amber and red packages, in the same space. This mixing is called "spatial mixing". In this case, the phosphor-converted single-color packages including the long-wavelength pass filters were driven with continuous waves (CW). Another method for achieving white light emission is associated with temporal mixing in which blue, green and red LEDs or blue, green, amber and red LEDs are mixed very rapidly at time differences to achieve white light emission. Even in this case, the efficiency of the multi-package white LED device including at least one phosphor-converted single-color package including the long-wavelength pass filter to achieve white light emission by temporal mixing is markedly improved compared to that of the conventional white LED device composed of an RGB multi-chip to achieve white light emission by temporal mixing. Particularly, the multi-package white LED device including at least one phosphor-converted single-color package including the long-wavelength pass filter uses pulse waves at around 500 kHz as a driving current to achieve white light emission by temporal mixing. FIGS. 47 to 50 graphically show changes in the efficiency of the phosphor-converted single-color chips including the long-wavelength pass filters depending on pulse driving. The graphs show that the luminous efficacies of the phosphor-converted single-color packages were at least 90% of the efficiency obtained when driven with continuous waves for spatial mixing. Accordingly, the efficiency of the multi-package manufactured using the phosphor-converted single-color package including the long-wavelength pass filter to achieve white light emission by temporal mixing is markedly improved compared to that of the conventional RGB multi-chip to achieve white light emission by temporal mixing.

The multi-package manufactured using the phosphor-converted single-color package including the long-wavelength pass filter achieves high efficiency of white light emission by temporal mixing, and therefore, it can be used to replace conventional RGB three-color LEDs for a field sequential liquid crystal display (LCD). A field sequential liquid crystal display is a highly efficient LCD technology in which respective color LEDs are turned on/off at time differences and liquid crystal cells are synchronized, eliminating the need for color filters on the front surface of LCD and achieving full colors. When conventional RGB LEDs are used, this technology does not bring about a satisfactory improvement in efficiency due to the problem of green gap. In contrast, the white LED device including the phosphor-converted single-color package including the long-wavelength pass filter according to the present invention can be used to manufacture a backlight with improved efficiency, as is evident from Example 6.

The multi-package white LED device of the present invention can be widely utilized in various industrial fields, including light emitting devices, lighting devices for automobiles, interior lighting devices, headlights, lamps, backlights and household lighting devices due to its excellent physical properties.

The invention claimed is:

1. A multi-package white LED device comprising a plurality of single-color LED packages from which light beams are irradiated and mixed to achieve white light emission wherein at least one package of the plurality of single-color LED packages comprises: a blue light source; a phosphor disposed on the blue light source to absorb blue light emitted from the blue light source and emit light in the wavelength range of 500 to 700 nm; and a long-wavelength pass filter disposed on the phosphor to reflect blue light and transmit light in the wavelength range of 500 to 700 nm, wherein the long-wavelength pass filter has a layer stack including first thin films and second thin films laminated alternately and repeatedly, the second thin films having a refractive index higher than that of the first thin films, and wherein the long-wavelength pass filter includes third thin films as an uppermost layer and a lowermost layer with at least one of the uppermost layer and the lowermost layer having an optical thickness corresponding to $1/80$ to $1/4.4$ of the peak wavelength of the reflection band of the blue light source.

2. The multi-package white LED device according to claim 1, wherein the light in the wavelength range of 500 to 700 nm is amber, yellow, green or red light.

3. The multi-package white LED device according to claim 1, wherein the phosphor is a yellow, amber, green or red phosphor.

4. The multi-package white LED device according to claim 1, wherein each of the first thin films and the second thin films constituting the layer stack formed between the uppermost layer and the lowermost layer has an optical thickness corresponding to $1/3$ to $1/5$ of the peak wavelength of the reflection band of the blue light source.

5. The multi-package white LED device according to claim 1, wherein the first thin films are adjacent to the third thin films.

6. The multi-package white LED device according to claim 1, wherein at least one of the uppermost layer and the lowermost layer has an optical thickness corresponding to $1/7$ to $1/9$ of the peak wavelength of the reflection band of the blue light source.

7. The multi-package white LED device according to claim 1, wherein the number of the single-color LED packages is two or more.

8. The multi-package white LED device according to claim 1, wherein the plurality of single-color LED packages comprises a) a combination of a red phosphor-converted single-color LED, a green phosphor-converted single-color LED, and a blue LED, b) a combination of a red LED, a green phosphor-converted single-color LED, and a blue LED, c) a combination of a red phosphor-converted single-color LED, an amber phosphor-converted single-color LED, a green phosphor-converted single-color LED, and a blue LED, d) a combination of a red LED, an amber phosphor-converted single-color LED, a green phosphor-converted single-color LED, and a blue LED, e) a combination of a red phosphor-converted single-color LED, a yellow phosphor-converted single-color LED, a green phosphor-converted single-color LED, and a blue LED, f) a combination of a red LED, a yellow phosphor-converted single-color LED, a green phosphor-converted single-color LED, and a blue LED, g) a combination of a yellow-based phosphor-converted white LED, a red phosphor-converted single-color LED, an amber phosphor-converted single-color LED, and a green phosphor-converted single-color LED, or h) a combination of a yellow-based phosphor-converted white LED, a red phosphor-converted single-color LED, and a green phosphor-converted single-color LED.

9. The multi-package white LED device according to claim 1, wherein the plurality of single-color LED packages comprises a) a combination of a yellow phosphor-converted single-color LED and a blue LED, b) a combination of a green-based phosphor-converted bluish green LED and an amber phosphor-converted single-color LED, or c) a combination of a green-based phosphor-converted bluish green LED and a red phosphor-converted single-color LED.

10. The multi-package white LED device according to claim 1, wherein the multi-package white LED device is part of a LED lamp.

11. The multi-package white LED device according to claim 1, wherein the multi-package white LED device is part of a blacklight unit for a display.

* * * * *